United States Patent [19]
Tracewell et al.

[11] Patent Number: 6,046,921
[45] Date of Patent: Apr. 4, 2000

[54] MODULAR POWER SUPPLY

[76] Inventors: Larry L. Tracewell, 8653 Finlarig Dr., Dublin, Ohio 43017; Matthew S. Tracewell, 2751 Cornish Ct., Powell, Ohio 43065

[21] Appl. No.: 08/866,434

[22] Filed: May 30, 1997

Related U.S. Application Data

[63] Continuation-in-part of application No. 29/059,632, Aug. 27, 1996, Pat. No. Des. 387,032.

[51] Int. Cl.[7] .................................................... H02K 7/20
[52] U.S. Cl. ........................ 363/141; 361/696; 361/687
[58] Field of Search ..................................... 363/141, 144, 363/146, 147; 361/687, 688, 694, 695, 696, 697

[56] References Cited

U.S. PATENT DOCUMENTS

| | | | |
|---|---|---|---|
| 4,691,274 | 9/1987 | Matouk et al. | 361/141 |
| 5,170,336 | 12/1992 | Getter et al. | 363/141 |
| 5,253,613 | 10/1993 | Bailey et al. | 123/41.31 |
| 5,289,363 | 2/1994 | Ferchau et al. | 363/141 |
| 5,440,450 | 8/1995 | Lau et al. | 361/695 |
| 5,831,847 | 11/1998 | Love | 363/141 |
| 5,930,112 | 7/1999 | Babinski et al. | 361/695 |
| 5,940,288 | 8/1999 | Kociecki | 363/144 |
| 5,945,746 | 8/1999 | Tracewell et al. | 307/43 |
| 5,959,836 | 9/1999 | Bhatia | 361/687 |

*Primary Examiner*—Adolf Deneke Berhane
*Attorney, Agent, or Firm*—Mueller and Smith, LPA

[57] ABSTRACT

Modular power supply apparatus wherein a plurality of d.c.-to-d.c. converters are coupled to an internally structured heat exchange channel through which fan driven air is passed in an unobstructed manner along a flow axis. Each of the converter modules is combined with a dedicated module circuit board which provides regulated output terminals in an orientation or direction arranged transversely to the flow axis. The opposite end of the module circuit boards are plugged into a main interconnect circuit board positioned along one side of the heat exchange channel. A support channel is provided outwardly of the main interconnect circuit board within which principal components of supporting circuitry are contained.

32 Claims, 12 Drawing Sheets

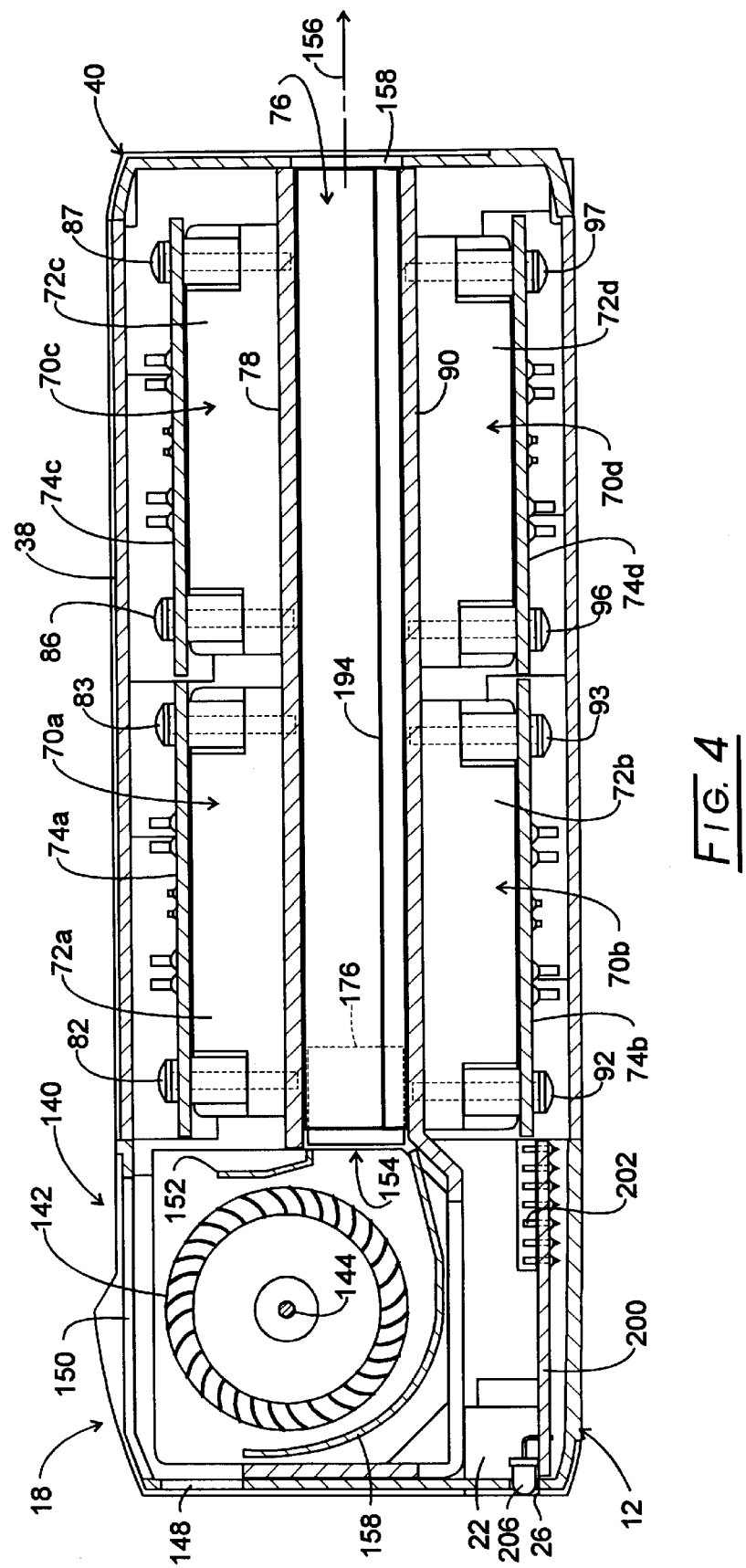

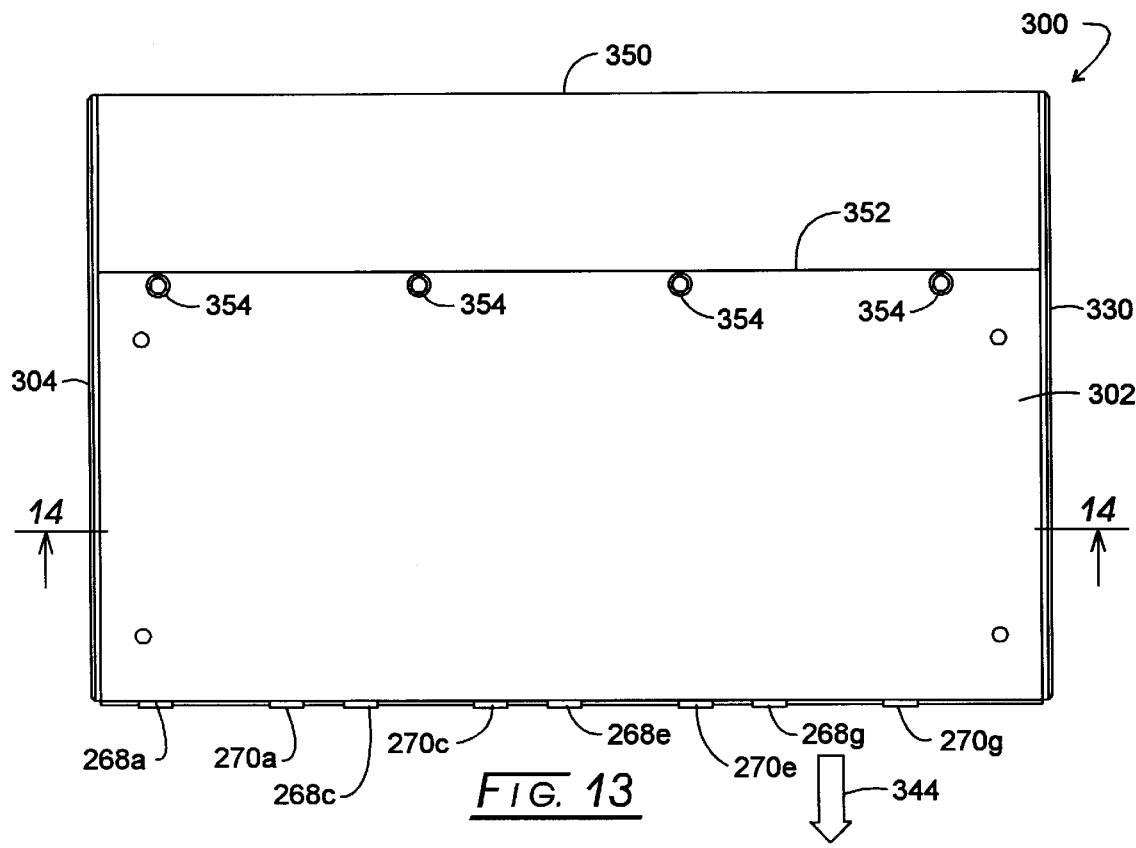
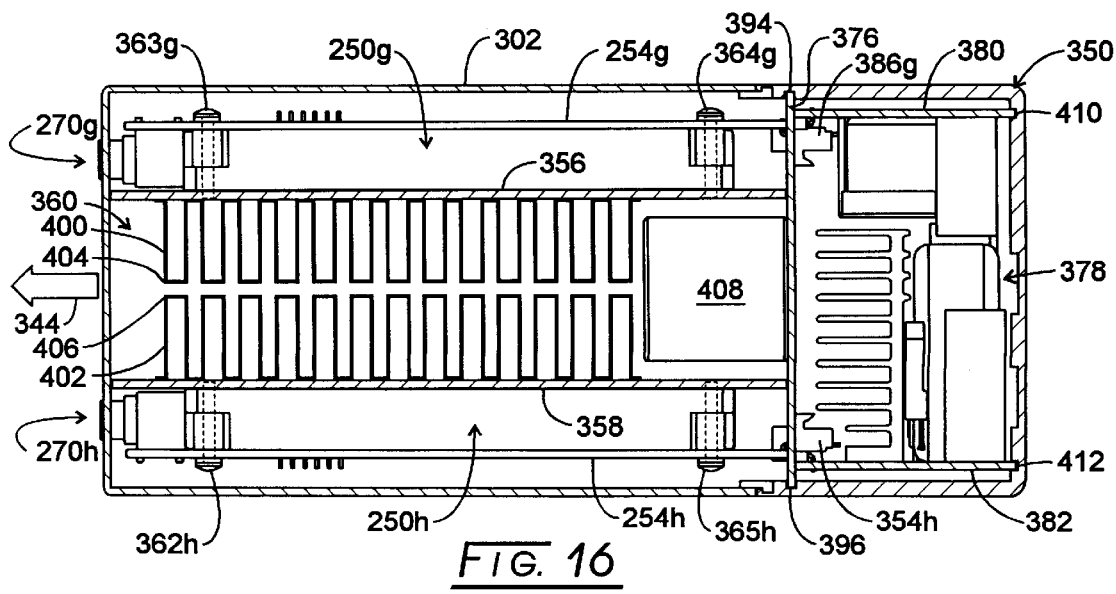

MODULAR POWER SUPPLY

CROSS-REFERENCE TO RELATED APPLICATIONS

This application is a continuation-in-part of U.S. application Ser. No. 29/059,632, filed Aug. 27, 1996, entitled "Power Supply for Electronic Circuits", now U.S. Pat. No. D 387,032, issued Dec. 2, 1997.

STATEMENT REGARDING FEDERALLY SPONSORED RESEARCH

Not applicable.

BACKGROUND OF THE INVENTION

Voltage regulators having a topology carrying out solid-state switching of unregulated voltage (typically across an inductor) for short intervals of time have gained wide acceptance in the electronics arts. Somewhat recently manifested as small, modular a d.c.-to-d.c. converters, the devices may be group packaged in a variety of configurations to provide a.c.-to-d.c. power supplies typically seen employed in computer, test and telecommunication systems. While the modular converters hold continuing promise for highly efficient performance, they necessarily are configured having a heat sinking function as part of their containment structures. Typically, the switching circuit components are fabricated in close, heat transferring adjacency with flat metal heat transfer surfaces.

By combining a number of the converter modules, the system designer readily achieves a variety of desired low voltage outputs and a select parallel interconnecting of the discrete modules provides for outputs of varying current capacity.

In general, practical combinations of the converter modules requires a packaging configuration for them which includes front end a.c. input treatment and a packaging geometry where they are mutually associated in relatively close adjacency. Such close spacing heretofore has engendered heat build-up difficulties and consequent degrading of the power supply packages. Typically, the converter modules employed are each prepackaged as "bricks" of thin rectangular shape. Each such module package then is coupled within an overall housing in combination with front-end circuitry and the like and fans are utilized for the purpose of removing converter-generated heat from the overall package. Because the typical converter module is fashioned having output and input terminals at what may be considered the "narrow" end thereof, a practical coupling of the power supply package within a given electronics system calls for substantial cabling from the power supply package at the end of the discrete modules and into buses leading to back planes and the like. This cabling has been found to hinder cooling air flow in the power supply packages with the consequence of highly undesirable heat build-up. Conventional packaging also positions the front end treatment circuitry within fan developed air flow upstream from the modules, thus detracting from the heat removing capacity of the air flow.

BRIEF SUMMARY OF THE INVENTION

The present invention is addressed to a power supply apparatus wherein modular d.c.-to-d.c. converters are selectively combined in a manner enhancing their performance. These individual converters are mounted upon heat sink assemblies of a housing which are structured to define a clear, unobstructed heat exchange channel through which fan driven air is passed. Air flow blockage resulting from cabling and support circuitry is avoided by a unique orientation of individual modules in which their regulated output connector terminals are directionally positioned transversely to the flow axis of air passing through the heat exchange channel. To efficiently achieve this transverse module orientation, a principal interconnect circuit board carrying an interconnect circuit is located along the length of one side of the heat exchange panel. This interconnect circuit board carries a combination of plug-in circuit connectors which are located to position each of the converter modules at a proper position in contact with a heat transfer surface of the heat exchange channel. Each converter, in turn, is mounted upon a dedicated module circuit board. These module circuit boards support the plug-in input connector assemblies which are coupled with the interconnect circuit board as well as the regulated output terminals which protrude outwardly in a direction transverse to the flow axis of the heat exchange channel. The individual module circuit boards additionally carry function monitoring circuits which extend outwardly in adjacency with the regulated output terminals and provide the user with an opportunity to carry out a variety of monitoring functions with respect to each converter module. As a highly convenient feature, each of the module circuit boards also carries an upwardly facing parallel interconnect circuit which combines with a corresponding share circuit mounted upon the main interconnect board and permits essentially any combination for interconnecting the CSHARE terminals of the d.c.-to-d.c. converters. With the arrangement, the user immediately may be apprised of the particular combinations of interconnected CSHARE terminals by observing a readily perceived connection on each module circuit board.

To enhance heat exchange between fan driven air and the modules, the heat exchanger components of the exchange channel include multiple channel configurations aligned with its flow axis. To further improve upon the heat related performance aspect of the converter modules, support circuitry for the most part is located within a support channel located in parallel with but outwardly from the heat exchange channel. Thus, heat contributed by such support circuitry generally is isolated from that air flow dedicated to a cooling of the d.c.-to-d.c. converter module.

The invention, accordingly, comprises the apparatus possessing the construction, combination of elements, and arrangement of parts which are exemplified in the following detailed description.

For a fuller understanding of the nature and objects of the invention, reference should be had to the following detailed description taken in connection with the accompanying drawings.

BRIEF DESCRIPTION OF THE DRAWINGS

FIG. 4 is a sectional view taken through the plane 4—4 shown in FIG. 2;

FIG. 13 is a top view of the power supply of FIGS. 10 and 11;

FIG. 16 is a sectional view taken through the plane 16—16 in FIG. 12;

DETAILED DESCRIPTION OF THE INVENTION

The power supplies of the present invention are implemented with two sizes of d.c.-to-d.c. converters or "bricks". These converters are combined with small supporting circuit boards carrying plug-in type electrical connector components. The smaller of the power supplies will support from 1 to 4 of the 60–150 watt plug-in converter modules to provide, for example, up to 500 watts of multi-output configurable power supply. Larger power supply configurations will provide, for example, 800 to a 2000 watt multi-output configurable power supply, the latter using converter/circuit board modules incorporating converters exhibiting 60–300 watt capabilities. In general, the larger of the devices will exhibit a footprint size of about 4½"×2½" with a thickness of about ½". A corresponding smaller one will exhibit a footprint with a size of about 2½" square with the same thickness. Such devices are marketed, for example by Astec America, Inc. of Carlsbad, Calif., under the trade designation "AMPSS".

Figure 1:
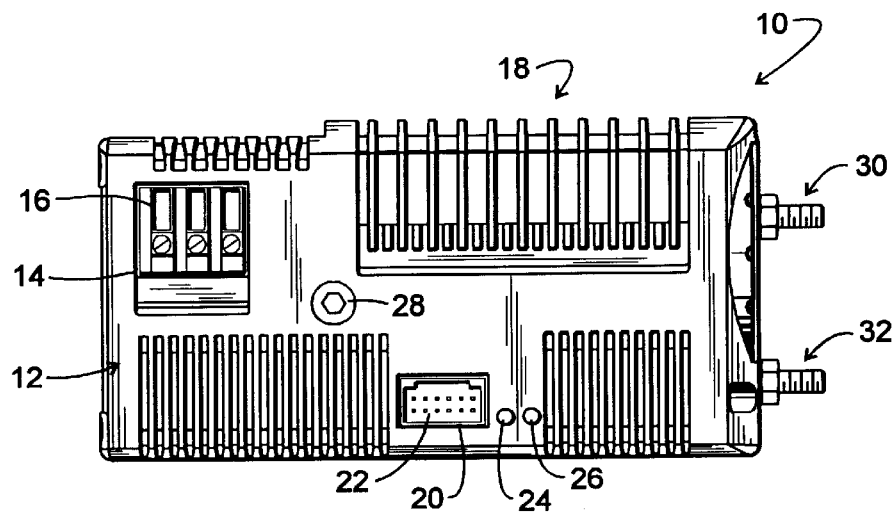
FIG. 1 is a front elevational view of one embodiment of the power supply according to the invention.
Figure 2:
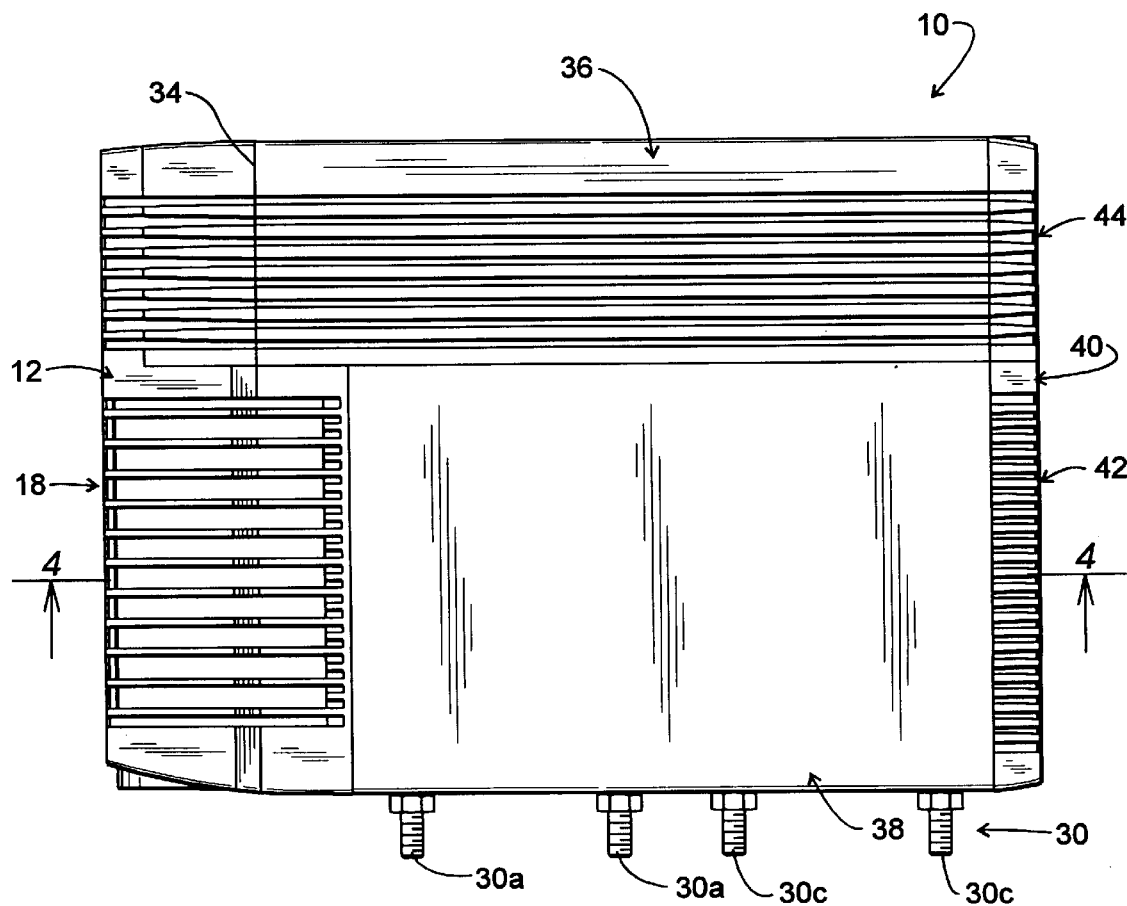
FIG. 2 is a top view of the power supply of FIG. 1.
Figure 3:
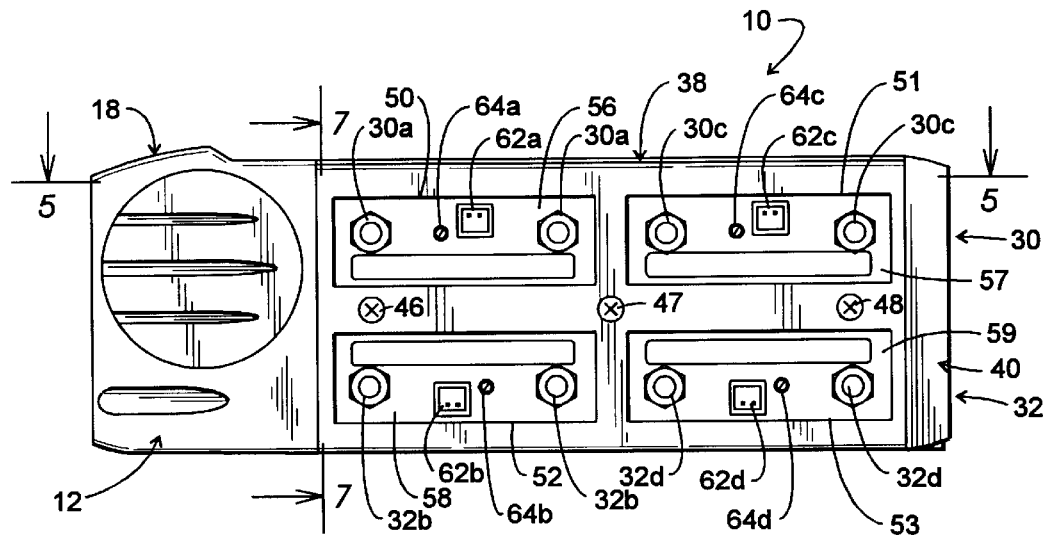
FIG. 3 is a right side view of the power supply of FIG. 1.

Referring to FIGS. 1–3, exterior views of a power supply apparatus 10 designed for accommodating up to four of the smaller d.c.-to-d.c. converter modules are presented. In the end view of FIG. 1, a die-cast end cover or air inlet end assembly of a housing is represented generally at 12. The vertical face of cover 12 includes an opening 14 through which a three wire a.c. input terminal assembly is located. The cover 12 further includes a fan inlet grill represented generally at 18 which is adjacent openings for a support channel described later. Located at the lower portion of cover 12 is an opening 20 within which a 12 pin connector 22 is located. Connector 22 provides a form of communications access to the package. Immediately adjacent opening 20 are openings 24 and 26 respectively within which are positioned visually perceptible indicators, for example, implemented as light emitting diodes (LEDs), providing a.c. ok and d.c. ok designated signals. Cover 12 is retained in position, inter alia, by a machine screw 28. Looking to the rightward side of the apparatus 18, two rows of regulated output connectors are shown in general at 30 and 32. The connectors of these rows 30 and 32 are implemented as a bolt-on variety and are seen to protrude from a side region, as opposed to an end, of the apparatus 10.

FIG. 2 reveals that the housing cover 12 has an angulated forward edge or parting line 34 which joins with an elongate U-shaped support housing on extrusion represented generally at 36. Extrusion 36 extends along one side of the apparatus 10 along with a U-shaped sheet metal cover assembly represented generally at 38. Cover assembly 38 and extrusion 36, in turn, extend to an air outlet assembly or cover represented in general at 40 having grill openings at 42 and 44. In the figure, the regulated output connectors of row 30 for one converter module are seen at 30a while a corresponding pair of these output connectors for a next adjacent converter module within the same row are shown at 30c.

FIG. 3 reveals the output side of the apparatus 10. In this regard, it may be observed that this output side is transversely oriented as compared with conventional power supply designs. In the figure, U-shaped cover assembly 38 is shown retained in position by three machine screws 46–48 and rectangular openings are formed therein as at 50–53 which receive respective inserts 56–59. Inserts 56–59 may be formed, for example, of plastic. Openings are formed in the inserts 56–59 to provide external access by the user to monitor function output connectors associated with each of the converter modules, such connectors being shown at 62a–62d. Additionally, each of the converter modules incorporates a variable resistor or potentiometer for user voltage output adjustment as are represented at 64a–64d. FIG. 3 further reveals that the d.c.-to-d.c. converter modules are arranged in two vertical rows and in side-by-side adjacency. In this regard, note that the module incorporating output terminals 30a is immediately above that incorporating output terminals 32b. Similarly, the converter module incorporating terminals 30c is positioned immediately above that having output terminals 32d. Further, it may be observed that the converter module having output terminals 30a is in adjacency with that having output terminals 30c and the converter module having output terminals 32b is in positional adjacency with that having output terminals 32d.

Referring to FIG. 4, this top/bottom and adjacency relationship of the converter modules is revealed in enhanced detail. In the figure, the converter modules are represented generally at 70a–70d, each such module being formed of a d.c.-d.c. converter 72a–72d combined with a module circuit board 74a–74d. Modules 70a–70d are tightly attached through their respective module circuit boards 74a–74d to the planar heat transfer surface defining assemblies of heat sinks forming a heat exchange channel represented generally at 76. In this regard, converter modules 70a and 70c are attached to a flat upper heat transfer surface 78 of one heat sink forming heat exchange channel 76. Attachment is by bolts 80–83 (see FIG. 5) which extend into corresponding taps within heat transfer surface 78. Correspondingly, the adjacent converter module 70c is connected to surface 78 by bolts 84–87 (see FIG. 5). In similar fashion, the bottom mounted converter module 70b is attached to the lower heat transfer surface 90 of another heat sink forming heat exchange channel 76 by four bolts, two of which are revealed at 92 and 93. Similarly, adjacent converter module 70d is connected to the heat transfer surface 90 by four bolts, two of which are revealed at 96 and 97.

Figure 5:
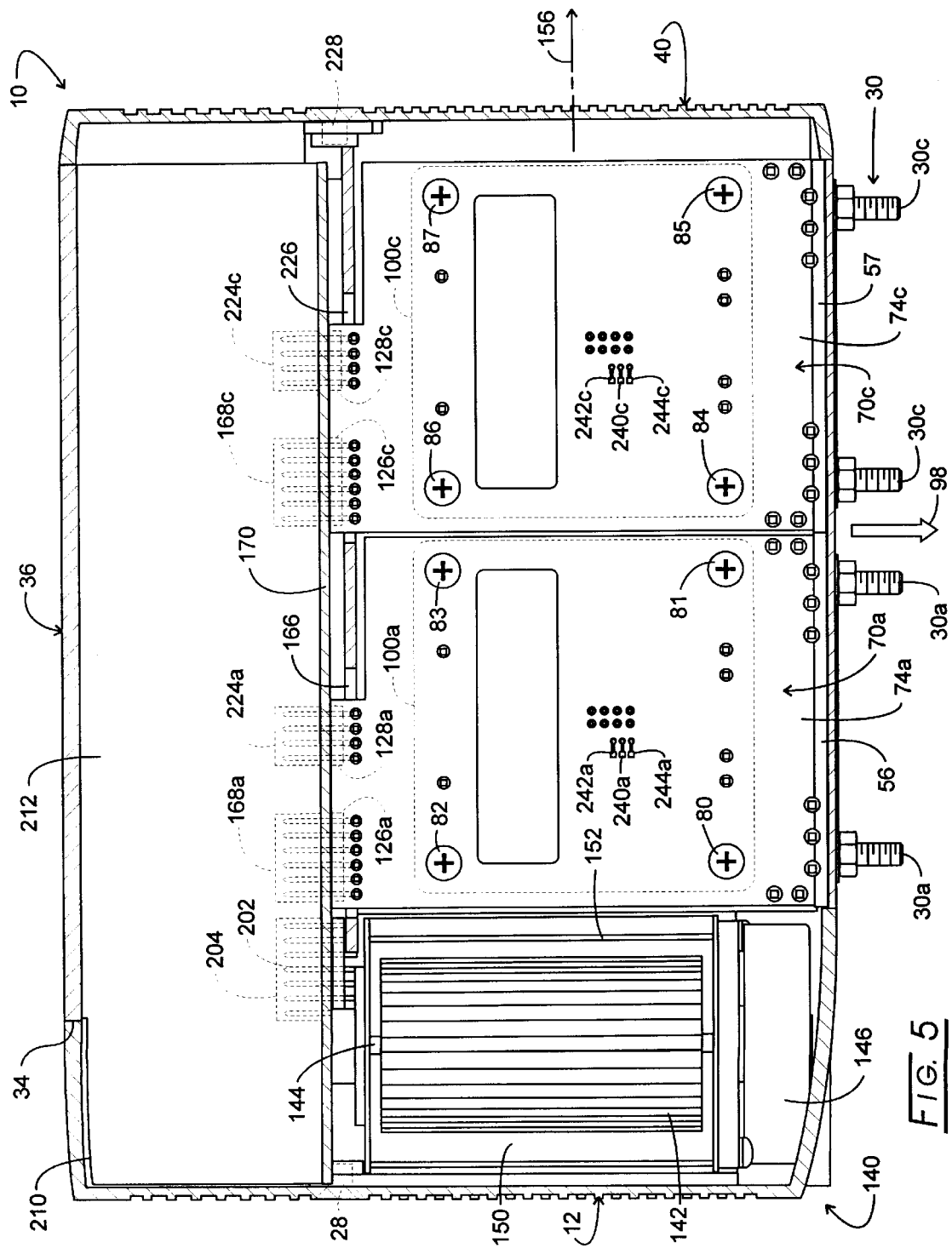
FIG. 5 is a sectional view taken through the plane 5—5 shown in FIG. 3.
Figure 6:
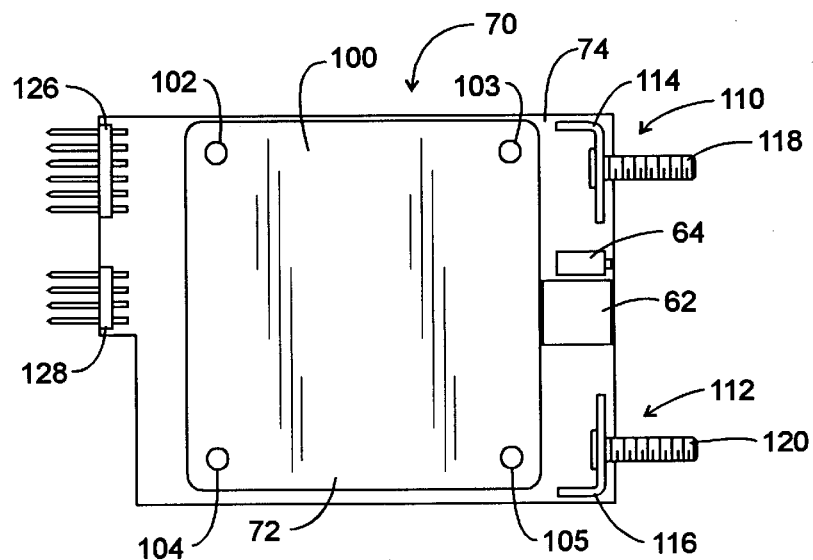
FIG. 6 is a top view of a converter module employed with the power supplies of FIGS. 1 and 17.

Looking momentarily to FIG. 6, a smaller d.c.-d.c. converter module is represented generally at 70 as being typical of those heretofore described by that number with an alphabetical suffix. Module 70 includes a d.c.-to-d.c. converter 72, the bottom surface of which is revealed to support a heat sink surface 100 intimately associated in heat transfer relationship with its regulator circuit components. The surface 100 typically is formed of a sheet of aluminum. Converter 72 is seen mounted upon a module circuit board 74. Bolting apertures 102–105 extend through the module circuit board 74, converter 72, and associated heat transfer surface 100 to permit connection with a heat transfer surface 240 as earlier described, for example, in connection with FIG. 5 at 80–83.

Circuit board 74 is configured to provide a variety of input and output signals and d.c. input power to the converter 70. In this regard, two regulated output connector assemblies represented generally at 110 and 112 are mounted on the circuit board 74 for providing regulated output voltage or power. To provide this output, each of the assemblies 110 and 112 is formed utilizing an L-shaped metal support shown, respectively, at 114 and 116, each of which, in turn, is connected by soldering to output leads formed upon the module circuit board 74. The L-shaped connectors 114 and 116, in turn, support connector bolts shown, respectively, at 118 and 120. As noted earlier herein, an externally accessed monitor function output connector also is provided at the output side of the module along with a trim potentiometer, those components being represented, respectively, at 62 and 64. Components 62 and 64 correspond, for example, with connectors 62a and trim resistor or potentiometer 64a described in connection with FIG. 3. The input and communications connectors for the converter 70 also are mounted upon the printed circuit board 74 as represented by upstanding module plug-in pin connector assemblies 126 and 128. As is apparent, by retaining the heat sink surface 100 of the converter 70 in tight adjacency against the heat transfer surfaces as described in connection with FIG. 4 at 78 and 90, an opportunity for carrying out highly efficient and unobstructed heat removal obtains.

Returning to FIG. 4, a fan assembly represented generally at 140 is seen to be positioned at the entrance to heat exchange channel 76. Looking additionally to FIG. 5, fan assembly 140 is of a cross flow variety, for example a type WL 1202-04W-B40-02 manufactured by NMB Technologies, Inc., Chatsworth, Calif. The assembly includes a relatively elongate impeller 142 having a squirrel cage configuration and mounted for rotation about a shaft 144. Rotational drive is imparted to axle 144 by a d.c. electric motor 146 (FIG. 5) and, as seen in FIG. 4, air intake is provided through openings 148 and 150 within fan inlet grill 18, whereupon it is driven by the fan 142 and directed by fan housing guidance components 150 and 152 to the entrance 154 of the heat exchange channel 76. Unobstructed cooling air thus is caused to flow through the heat exchange channel 76 along a flow axis represented by arrow 156 and thence through exit slots 158 within a outlet cover 40. Inasmuch as there are no cable or other connections to converter module terminals in the vicinity of this outlet 158, there is no interference to the flow of air through the channel 76. FIG. 5 shows the regualted output connectors as at 30a and 30c to be oriented in a given direction represented by arrow 98. That direction at 98 is seen to be transverse or normal to the air flow path represented at arrow 156.

Figure 7:
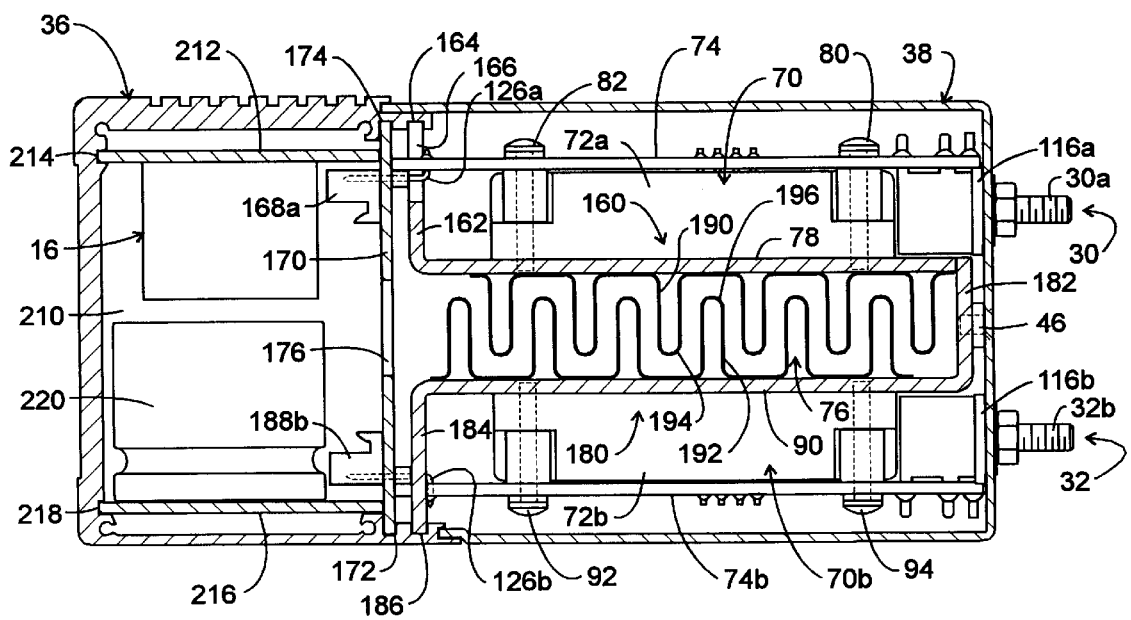
FIG. 7 is a sectional view taken through the plane 7—7 in FIG. 3.

Referring additionally to FIG. 7, the heat exchange channel 76 is seen to be formed having an L-shaped upper heat sink assembly represented generally at 160 which includes the heat exchange surface 78 and which extends upwardly at 162 to be engaged within a channel-shaped groove 164 formed within extrusion 36. The assembly 160 includes openings, one of which is shown at 166 through which the pin connectors as described in connection with FIG. 6 at 126 and 128 of the module circuit boards may extend as at 128a. This provides for engagement within corresponding interconnect plug-in connector sockets as at 168a which, in turn, are mounted upon the upwardly disposed portion of an elongate interconnect circuit board, sometimes referred to as a "mother board" 170. Interconnect circuit board 170 is seen to be positioned within channel-shaped slots 172 and 174 formed within extrusion 36. Note, additionally, the presence of an aperture or opening 176. Interconnect circuit board 170 is seen to form one side boundary of the elongate heat exchange channel 76. The third component of this channel 76 is a lower heat sink assembly represented generally at 180, the elongate form of which has a somewhat Z-shaped cross-section with an upwardly extending flange portion 182 which is attached to sheet metal cover 38 by the earlier-described machine screws 46–48 (FIG. 3). In addition to providing the earlier-described lower heat transfer surface 90, the lower heat sink assembly 180 additionally is configured having a downwardly extending flange portion 184, the tip of which engages a channel-shaped slot or groove 186 formed within extrusion 36. As is the case with the top mounted converter modules, the module circuit board components of the bottom converter modules extend through openings in the flange 184 to engage corresponding plug connectors on the interconnect circuit board 170. Shown in FIG. 7 is the module plug-in (pin) connector grouping 126b extending into supporting and electrical circuit completion connection with an interconnect plug-in connector 188b. Connector 188b, as before, is coupled to interconnect circuit board 170. To enhance its heat removal capabilities, the heat exchange channel 76 is configured such that upper heat transfer surface 78 and lower heat transfer surface 90 are each bonded to one multi-channel defining or undulating serpentine shaped intra-channel heat exchanger. These heat exchangers are configured to provide metal heat exchange surfaces of enhanced area extent. In this regard, one such serpentine intra-channel heat exchanger is shown at 190 in physical and thermal bond with heat transfer surface 78 and a similar structure 192 is thermally and physically bonded to the heat transfer surface 90. Note that these multi-channel assemblies are interdigitated within channel 76. Connection between the serpentine intra-channel devices as at 190 and 192 with respective surfaces 78 and 90 preferably is by a silicon-based cement exhibiting high thermal conductivity. Note in FIG. 7 that as part of the noted interdigitation of the heat exchangers, heat exchanger 190 is seen to extend to a sequence of downwardly depending intraduct rounded peaks at a level 194 while, correspondingly, heat exchanger 192 provides intraduct peak components which extend to a level 196. Heat exchangers 190 and 192 may be fabricated, for example, for sheet aluminum having a thickness of about 0.015 inch Returning to FIG. 4, positioned below the fan assembly 140 is a daughter board 200 which includes a pin connector 202 electrically communicative with a plug affixed to main interconnect board 170 and seen at 204 in FIG. 5. Circuit board 200 carries a support function control circuit which incorporates an earlier-described 12-pin connector 22 as well as the earlier-discussed two LEDs present at end cover 12 openings 24 and 26 (FIG. 1), one of which is shown in the instant figure at 206. This supporting control circuit includes an auxiliary power supply providing a utility or "housekeeping" 12 v and 5 v for use by all circuitry of the apparatus 10. The 12 v output of this circuitry also energizes the motor 146 of fan assembly 140. Accordingly, at such time as a.c. power is applied at connector 16, the fan assembly 140 is activated. The control circuit also conveys and/or receives user information at the 12-pin connector 22 permitting the user to enable or inhibit the operation of all of the converter modules or to so control selective ones of them. Additionally, the user is provided signals representing that the a.c. input is appropriate and that rectified d.c. input to the d.c.-to-d.c. converters is at proper level. Also conveyed is an on/stand-by signal for turning on the power supply along with ground and 5 v d.c. from the auxiliary power supply. A.c. ok and d.c. ok signals are provided to the connector 22 which are generated elsewhere but are conveyed through an opto-coupling arrangement at the instant control circuit.

Returning to FIG. 7, a circuit support channel or chamber is seen to be established within the extrusion 36 portion of the power supply housing outwardly of the interconnect circuit board 170. Two daughter boards are seen within this support channel or region 210, one being upwardly disposed at 212. Circuit board 212 is connected between interconnect board 170 and a channel-shaped groove 214 formed in the extrusion 36. The support circuits carried by circuit board 212 function to provide EMI filtering, in-rush current limiting, and transient suppression functions.

Located below circuit board 212 within the region 210 is another daughter circuit board 216 electrically coupled with the interconnect circuit board 170 and extending within a channel-shaped groove within region 210. Circuit board 216 carries a rectification circuit as well as a conditioning function which senses the voltage of in-coming a.c. line current and adjusts the d.c. output supplied to the d.c.-d.c. converter modules in accordance with that a.c. sensed voltage value. Thus, the system auto-ranges to accommodate for the voltage levels of different geographic regions. Also supported upon circuit board 216 are energy storage capacitors as at 220 which provide hold-up or ride-through functions to accommodate for vagaries in the a.c. input to the power supply 10. The earlier-described opening 176 may be seen to provide heat exchanging air flow to the support channel 210 for cooling purposes which flows in parallel with flow axis 156, exiting from openings (not shown) within outlet cover 40. In general, heat contribution to channel 76 from supporting monitoring and control circuitry is avoided. However, the substantial proportion of fan-driven cooling air is asserted at the channel 76.

Returning to FIG. 5, the outwardly-disposed module circuit boards 74a and 74c are revealed. Circuit board 74a is seen to incorporate module plug-in (pin) connectors 126a and 128a which extend, respectively, within interconnect plug-in (plug) connectors 168a and 224a mounted, in turn, to the elongate main connector circuit board 170. In similar fashion, the module plug-in connectors 126c and 128c extend into corresponding respective interconnect plug-in connectors 168c and 224c coupled, in turn, to the interconnect board 170. As above-discussed, these pin connectors from the module circuit boards extend through openings within the upwardly-disposed extension 162 (FIG. 7) of upper heat sink assembly 160. A similar opening is shown at 226 in the figure. The figure also shows the utilization of a machine screw 228 to retain the outlet cover 40 in position.

Very often in configuring the power supply 10, the user will wish to enhance the current output capacity of the system for given regulated voltage outputs. This is carried out by coupling these outputs in parallel. However, to provide for such parallel couplings without permitting a dominance of one converter or another in supplying higher current demands, the converters themselves are configured with a current sharing circuit function. That function basically compares the average current provided by all converter modules for a given shared condition with individual currents. Where a difference from one module to the other is detected, correction then is made. However, the "CSHARE" signal involved requires the interconnecting of appropriate share terminals of the d.c-to-d.c. involved converters. This is substantially simplified for the power supplies of the instant invention through the utilization of the module circuit boards 74a–74d. In this regard, the earlier-described (FIG. 3) top and bottom orientations of the modules are recognized as well as the adjacent orientations of them. These orientations are employed with an inter-module parallel coupling circuit carried by each module circuit board 74 and an interconnect share circuit carried by the interconnect board 170. To provide for a desired coupling of the CSHARE signal, the terminal of each d.c.-d.c. converter carrying the CSHARE signal is electrically coupled to a centrally disposed share connector present as a small copper pad 240 located on the outwardly facing surface of the module circuit board 74. In FIG. 5, these centrally disposed pads are shown at 240a and 240c. Corresponding central pads are associated with the lower disposed converters and associated module boards as described in connection with FIG. 4 at 74b and 74d. A closely adjacent next share connector pad as at 242 is connected with a vertical connection circuit through the interconnect share circuit of interconnect board 170 between upper and lower disposed circuit module boards as at 74a and 74b. Similarly, a second closely adjacent share connector copper pad at 244 is interconnected through an adjacent connection circuit and the interconnect share circuit with adjacent module circuit board 74. For example, for the modules 70a and 70c seen in FIG. 5, pad 242a is interconnected through the interconnect board 170 with a corresponding pad located upon module board 74b. Similarly, pad 242c on module circuit board 74c is coupled through the interconnected circuit board 170 with a corresponding pad located upon module circuit board 74d. For the adjacent arrangement, in FIG. 5, the pad at 244a is interconnected through the interconnect board 170 with pad 244c. By simple jumpering or soldering, the central pads 240 can be connected with either or both of the adjacent share connector pads to configure the system to the user's desire. Of additional importance, by simply observing the outwardly exposed surfaces of the module circuit board 74, the user may immediately be aware of the distribution of the CSHARE signal. While this feature can be implemented by discrete switching, for example, by installing a DIP gang switch, the utilization of the small copper pads is an approach which conserves important space.

Figure 8:
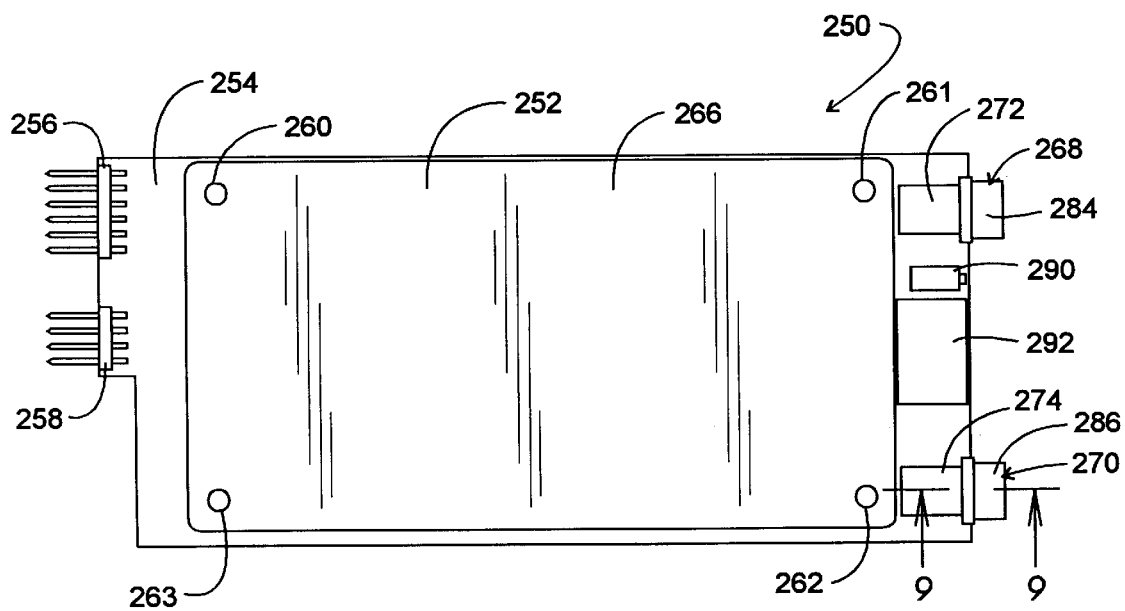
FIG. 8 is a top view of a converter module employed with the power supply described in conjunction with FIG. 10.

Referring to FIG. 8, the earlier-described larger one of the d.c.-to-d.c. converter modules is represented in general at 250. Module 250 employs a d.c.-to-d.c. converter 252 of larger size and capacity than that described in conjunction with FIG. 6 above. This converter 252 is an isolated, single output d.c-to-d.c. converter providing up to 240 watts output. It is coupled electrically and physically with a module circuit board 254, the circuit leads of which extend from the converter 252 functional terminals and inputs to an interconnected circuit or "mother" board via input connector assemblies provided as pin connectors 256 and 258. Holes are provided both within the module circuit board 254 and the converter 252 as at 260–263 such that the converter module 250 may be bolted to a heat transfer surface. In this regard, the active components of the converter 252 are arranged in heat exchange relationship with a heat exchange surface formed as a sheet of aluminum and seen at 266.

Figure 9:
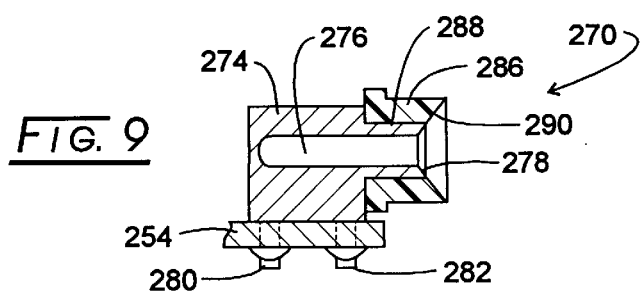
FIG. 9 is a partial sectional view taken through the plane identified at 9 in FIG. 8.

Converter module 250 may employ the same type of regulated output connectors as module 70. However, an advantage of the present design, wherein the outputs are transversely located with respect to fan driven air flow, permits this output terminal function to be of a plug-in variety. This permits, for example, an advantageous coupling to an associated circuit board as compared to connections by cabling. Accordingly, for illustrative purposes, the converter module 250 is shown having its regulated output connectors provided as plug-in connectors represented generally at 268 and 270. Looking additionally to FIG. 9, each of these connectors 268 and 270 is formed as an upstanding metal block as seen, respectively, at 272 and 274 into which a pin receiving bore is located. Such a pin receiving bore is seen in FIG. 9 at 276. That figure also reveals that the opening to the bore 276 is chamfered or beveled at 278 and that the block 274 is connected by soldering to output pins 280 and 282 extending through module circuit board 254. To facilitate the process of plugging these connectors into an adjacent circuit board, plastic guidance caps 284 and 286 are mounted over a forwardly protruding cylindrical portion of the block 274 as seen at 288 in FIG. 9. FIG. 9 shows that each of the caps themselves are beveled or chamfered as at 290 for the purpose of facilitating pin insertion.

Returning to FIG. 8, the converter module 250 is seen to incorporate a trim potentiometer 290 and a multi-pin monitor function output connector 292 at the output side as in the case of module 70. As before, the pin connector 292 provides user access to the internal functions of the d.c-to-d.c. converter 252 through its monitor function terminals.

Figure 10:
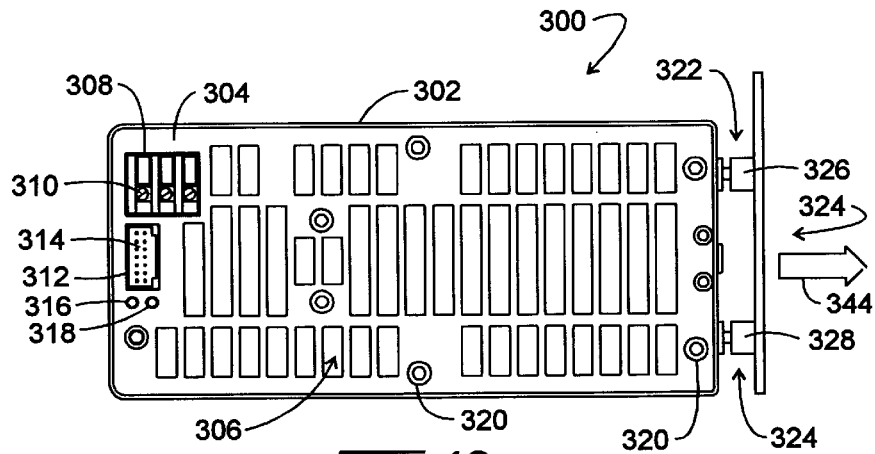
FIG. 10 is a front view of another power supply embodiment of the invention.

A plurality of converter modules as at 250 are employed with a housing exhibiting the advantages described in connection with power supply 10. In this regard, the fan driven flow of cooling air within the housing assembly of apparatus 10 employed is directed transversely to the regulated output terminals of each of the converter modules. Looking to FIG. 10, such a power supply is represented generally at 300. With respect to this outlet end view in FIG. 10, the power supply 300 is seen to have a generally rectangular cross section. In general, the housing assembly of apparatus 300 is comprised of a rigid internal frame (not shown) surmounted by a sheet metal cover assembly 302. The air outlet end assembly or panel of device 300 is represented in FIG. 10 at 304. Panel 304 incorporates a plurality of rectangular openings represented generally at 306 to provide for air outflow. One opening at 308 exposes three wire a.c. input terminals 310 and immediately below, a next rectangular opening 312 provides for access to a 14 pin connector 314 for user interfacing. Next below opening 312 are two openings carrying light emitting diodes (LEDs) as represented at 316 and 318. As before, these diodes indicate an a.c. ok and d.c. ok function as in the case of power supply 10. Panel 304 is retained in position by machine screws, certain of which are identified at 320.

As before, the output terminal connectors for power supply 300 are located at a side of the device in terms of the direction of air flow, i.e. they extend in the given (transverse) direction represented by arrow 344. For the present embodiment, these regulated output connectors are of the plug-in variety shown at 268 and 270 in FIG. 8. One row of such plug-in (pin insertion) connectors is shown at 322 and another row at 324. These rows of connectors are seen engaged with corresponding rows of pins of a load-defining circuit board assembly represented generally at 324. In this regard, a row of pins is shown at 326 extending from attachment with the assembly 324 and engaging the connectors at row 322. Correspondingly, a row of pins is seen at 328 engaging a row of corresponding connectors 324. Such an arrangement is feasible inasmuch as no coolant air blockage is imposed by circuit board assembly 324 with the geometry of the instant power supplies.

Figure 11:
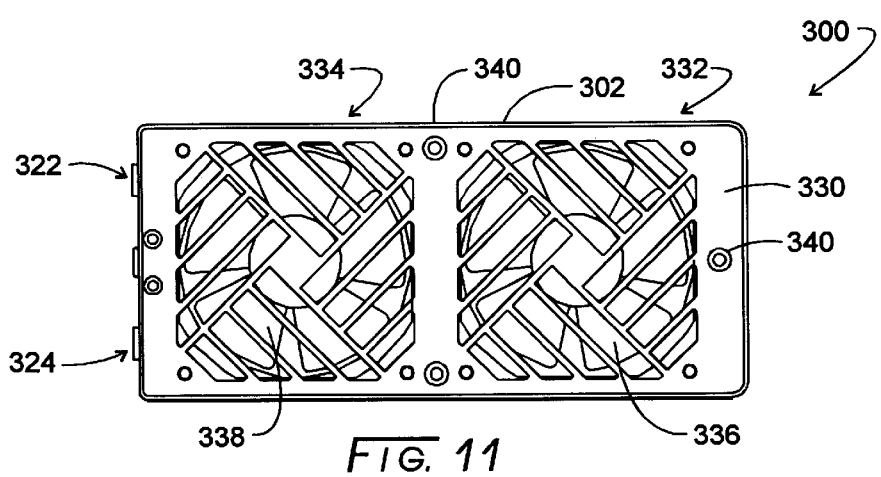
FIG. 11 is a rear view of the power supply of FIG. 10.

FIG. 11 reveals the air inlet end assembly or panel of the power supply 300. In that figure, the cover assembly 302 reappears surmounting an air inlet end panel 330. Panel 330 has two quadrature-design air input opening grids 332 and 334 immediately behind which are located axial fans shown, respectively, at 336 and 338. The panel 330 is retained in position by machine screws, certain of which are represented at 340.

Figure 12:
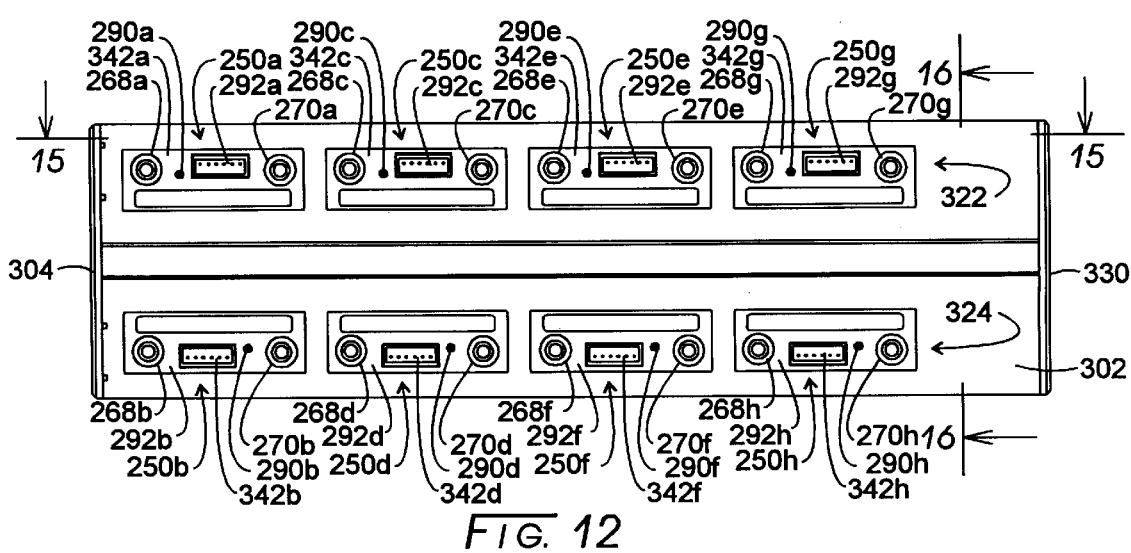
FIG. 12 is a right side view of the power supply of FIGS. 10 and 11.

FIG. 12 reveals the regulated output side of the power supply 300. The figure shows a packaging of eight converter modules 250 which are identified with the same numeration employed in connection with FIG. 8 but with an alphabetical suffix. The module circuit board components of these converter modules 250a–250h, as before, extend through openings formed in rectangular plastic inserts mounted within the cover 302. Such inserts are represented at 342a–342h. Also seen accessible from this side of the power supply 300 are trim potentiometers 290a–290h and multiple pin, monitor function output connectors 292a–292h. With the arrangement shown, from one to eight regulated d.c. outputs may be provided. This can derive, for example, 1600 watts of maximum output power. As before, the converter modules 250 are arranged such that their orientation may be designated top and bottom as shown, respectively, at 250a and 250b, and in adjacency, as converter module 250a is with respect to converter module 250c and converter module 250b is with respect to converter module 250d. The same arrangement for interconnecting the CSHARE function signal is provided as with power supply 10.

As in the case of power supply 10, the discrete converter modules of power supply 300 are readily accessible by the user. Looking to FIG. 13, a top view of power supply 300 reveals the top of U-shaped cover assembly 302 extending to an elongate U-shaped support housing present as an extrusion 350, the junction or parting line between the two components being seen at 352. Cover assembly 302 is retained in position by machine screws, certain of which are identified at 354.

Figure 14:
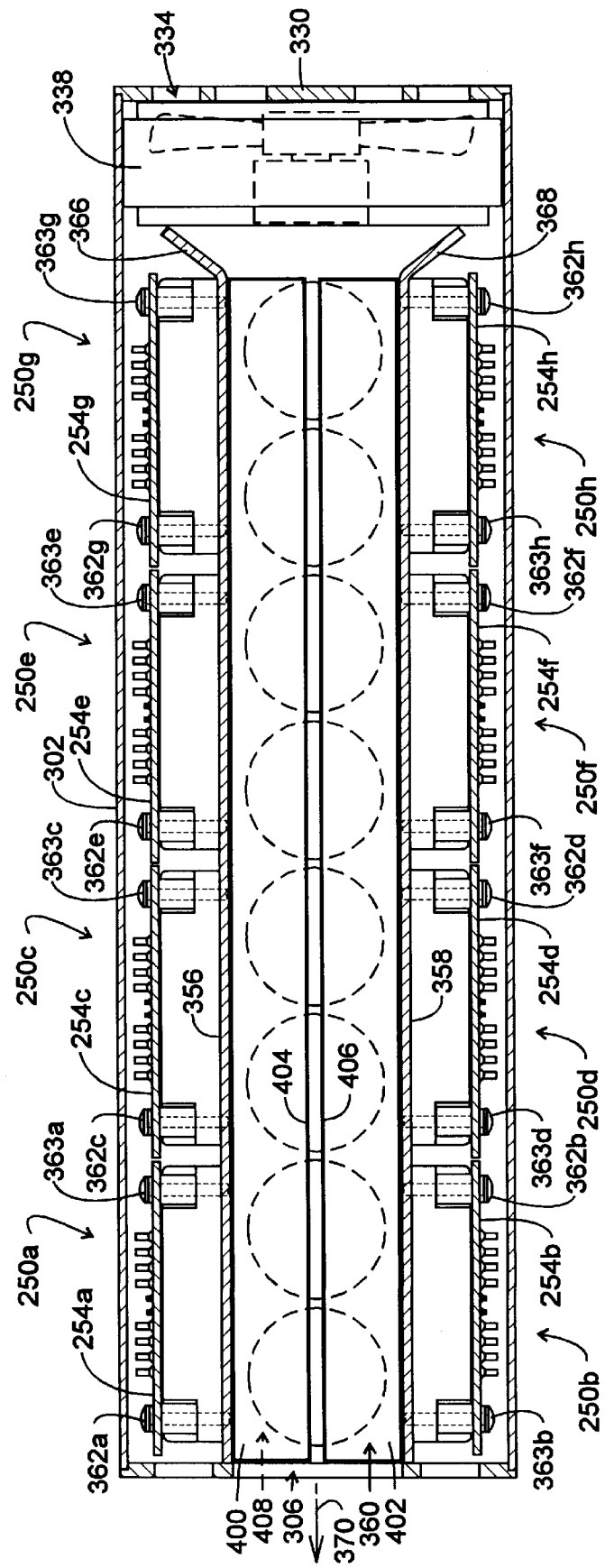
FIG. 14 is a sectional view taken through the plane 14—14 in FIG. 13.

Referring to FIG. 14, converter modules 250a–250h are seen to be rigidly and tightly secured in groups of four to the heat transfer surfaces 356 and 358 of heat exchangers forming a heat exchange channel represented generally at 360. Each of the converter modules 250a, 250c, 250e, and 250g is secured to the heat exchange suface 356 with machine screws which are identified in general 362–365 and with the appropriate alphabetical suffix for a given converter module (see FIG. 15). Such an arrangement assures a close abutting association between the heat exchange surface 266 (FIG. 8) of the d.c.-to-d.c. converter component of each module with the surface 356. Similarly, machine screws 362–365 (with associated alphabetical suffix) are utilized to retain converter modules 250b, 250d, 250f, and 250h in tight abutment against heat exchange surface 358.

Figure 15:
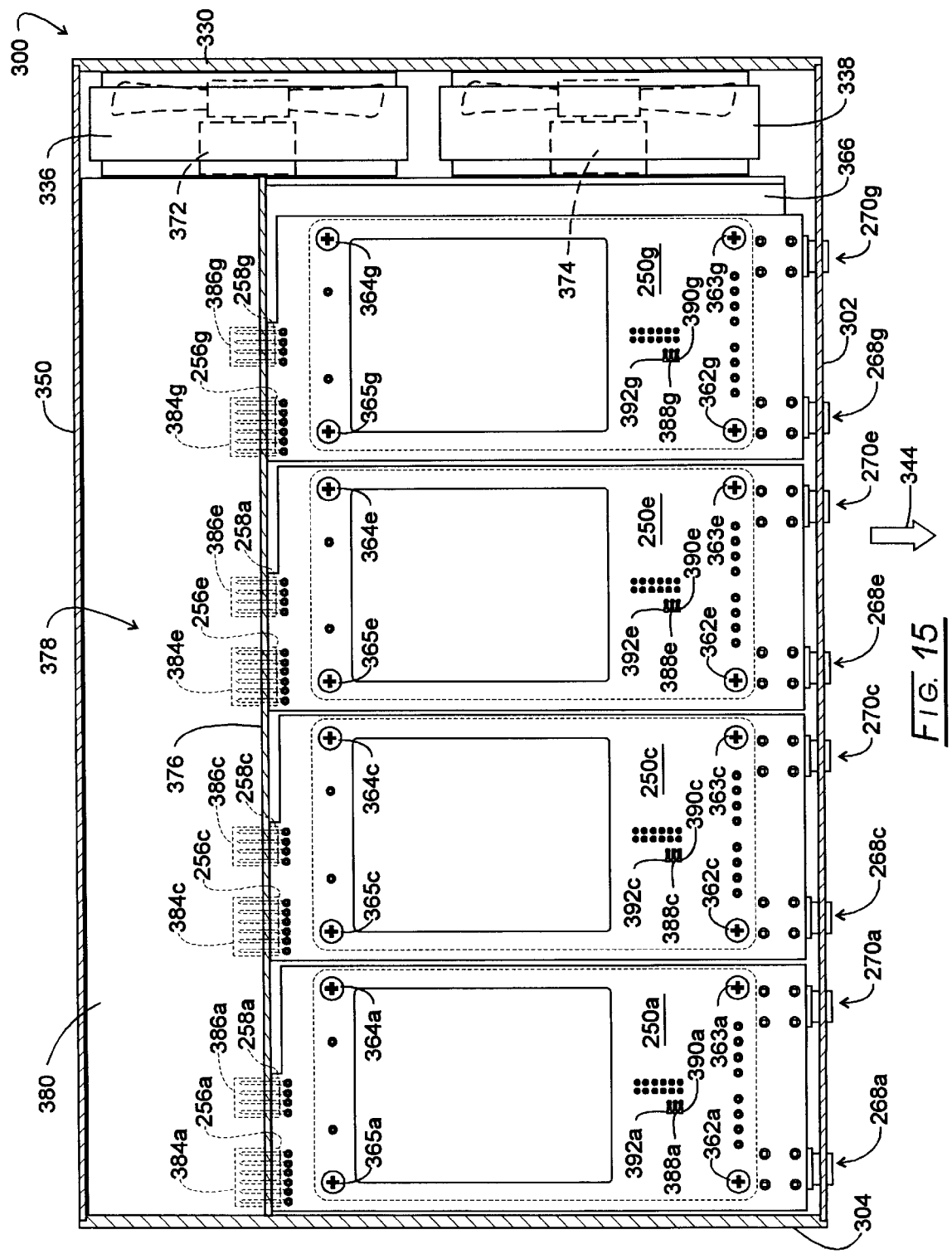
FIG. 15 is a sectional view taken through the plane 15—15 in FIG. 12.

The sheet metal components constituting heat exchanger surfaces 356 and 358 flare outwardly at the inlet side of the heat exchange channel 360 as shown, respectively, at 366 and 368. This functions to direct air flow generated from the fans 336 and 338 into channel 360 in the course of developing air flow along a flow axis 370. Fans 336 and 338 may be provided, for example, as Boxer Axial Cooling Fans, D.C. 3110KL series, model 04W-B50-P00 marketed by NMB Technologies, Inc. of Chatsworth, Calif. FIG. 15 reveals that fans 336 and 338 are powered by respective d.c. motors 372 and 374. The figure also shows the presence of an interconnect circuit board or "mother board" 376. As before, the interconnect circuit board 376 serves as one side of the heat exchange channel 360, contributing a surface of a support channel region represented generally at 378 surmounted by the extrusion 350. The channel 378 supports two daughter circuit boards, an upper one of which is seen at 380. With the arrangement shown, it may be observed that a portion of the air flow generated from fan 336 passes through that secondary channel 378 to provide cooling for support and interconnect circuitry contained therein.

In fashion similar to the arrangement of power supply 10, the converter modules 250 of power supply 300 plug into corresponding plug connectors mounted upon circuit interconnect board 376. In FIG. 13, for example, module plug-in connectors (pin connectors) 256*a*, 256*c*, 256*e*, and 256*g* are removably inserted within respective plug connectors 384*a*, 384*c*, 384*e*, and 384*g*. Similarly, module plug-in (pin) connectors 258*a*, 258*c*, 258*e*, and 258*g* are inserted within respective interconnect plug-in connectors 386*a*, 386*c*, 386*e*, and 386*g*. A corresponding arrangement is provided with respect to converter modules 250*b*, 250*d*, 250*f*, and 250*h*. So connected to the interconnect circuit board 376, the regulated output connectors 268 and 270 are seen to be oriented in the transverse given direction represented by arrow 344.

Power supply 300 also provides for a convenient interconnection of the CSHARE signal as may be desired by the user. As before, the top/bottom orientations as well as the adjacent orientations of the converter modules 250 are recognized and associated by appropriate circuit interconnection through the interconnect circuit board 376. The terminal of each d.c.-to-d.c. converter 254 carrying the CSHARE signal is electrically coupled to a centrally disposed small share connector pad 388 forming one of three components of an inter-module parallel coupling circuit. Pad 388 is located on the outwardly facing surface of each module circuit board 254. For example, those centrally located connector pads are shown in FIG. 15 in combination with a converter module associated alphabetical suffix as at 388*a*, 388*c*, 388*e*, and 388*g*. A closely adjacent next copper pad as at 390 is connected by a vertical connecting circuit on the module circuit board through the interconnect share circuit component of the inerconnect circuit carried out interconnect board 376 between upper and lower disposed circuit module boards. For example, between converter module boards 254*a* and 254*b*. These pad connectors are shown in FIG. 15, for example, at 390*a*, 390*c*, 390*e*, and 390*g*. Similarly, a copper pad 392 on the module circuit board 254 is coupled by an adjacency connecting circuit through the interconnect share circuit on the interconnect circuit board 376 with a corresponding pad located upon a module circuit board at an adjacent location. For example, in FIG. 15, the pad connector 392*a* is coupled through interconnect circuit board 376 to pad 392*c*. By simple jumpering or soldering, the central pads 388 can be be connected with either or both of the adjacent pads to configure the system to the user's desire. As noted earlier, by simply observing the inter-module parallel coupling circuit on the outwardly exposed surfaces of the module circuit boards 254, the user may be aware immediately of the distribution of the CSHARE signal. While this feature can be implemented by discrete switching, for example, by installing a DIP gang switch, utilization of the small copper pads is an approach which conserves important packaging space.

Returning to FIG. 14 and looking additionally to FIG. 16, heat exchange channel 360 additionally is seen to include two, multiple channel metal heat exchanger assemblies 400 and 402, the channels of which are aligned in parallel with the flow of air through channel 360 along axis 370. Exchanger assemblies 400 and 402 are coupled in physical and thermal bond with respective heat exchange surfaces 356 and 358 and are formed having a corrugate or undulating pattern extending to lands at respective levels 404 and 406 within the channel 360. Note in the instant embodiment, the intra-duct peaks at levels 404 and 406 are not arranged in an interdigitated structuring as is the case for power supply 10, but are spaced apart. Heat exchange channel 360 also is seen to contain a linear array of capacitors represented in general at 408 which are, in turn, coupled to the interconnect board 376. FIG. 16 also reveals that the support channel 378 within the extrusion 350 and bounded by the interconnect board 376 contains an additional daughter circuit board 382 at its lower region. Daughter circuit board 380 is seen to slideably extend within a channel-shaped slot 410 in extrusion 350 and to be plugged into the interconnect board 376. Similarly, daughter circuit board 382 extends within a channel-shaped slot 412 and is connected in physical and electrical association with interconnect circuit board 376. A mounting of the interconnect circuit board 376 within slots 394 and 396 formed within the extrusion 350 also is revealed in the figure.

Figure 17:
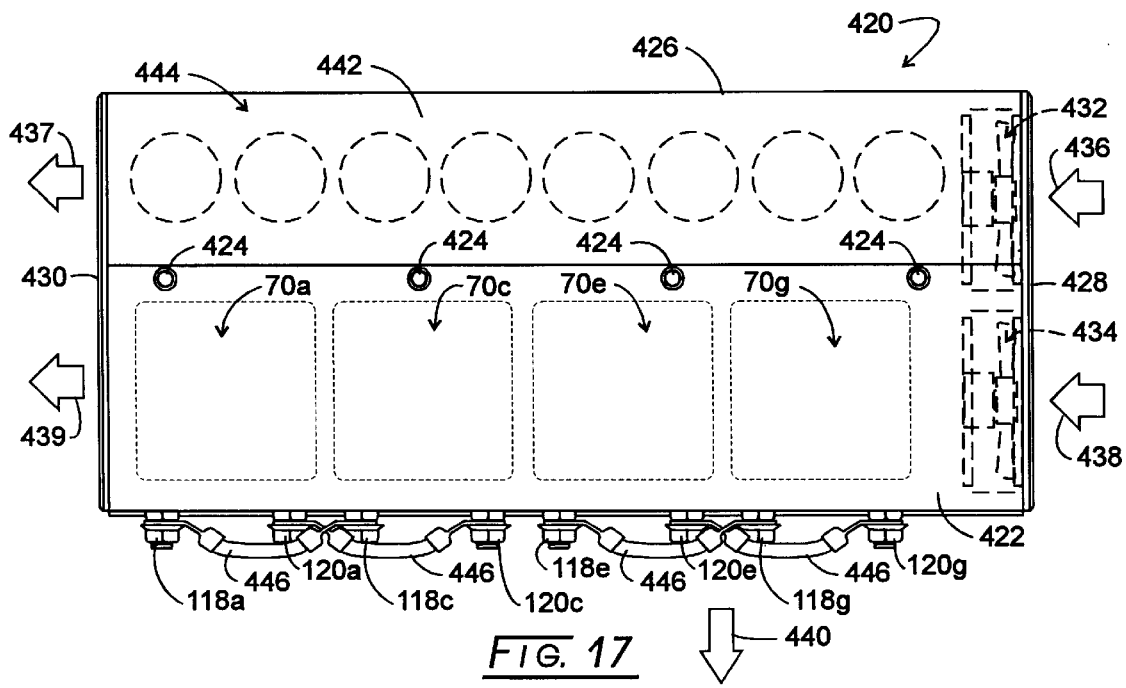
FIG. 17 is a top view of another power supply embodiment according to the invention.

A packaging arrangement similar to that described in connection with power supply 300 may be developed in connection with the smaller converter module as described at 70 in connection with FIG. 6. By employing, for example, eight of these converter modules 70, a power supply with about an 800 watt multi-output capacity can be evolved. FIG. 17 illustrates such a power supply 420 with components shown in phantom to reveal internal structure. As before, power supply 420 includes a U-shaped sheet metal cover assembly 422 which is attached by machine screws 424 to a U-shaped support housing provided as an extrusion 426. An air inlet end panel assembly is provided at 428 and an air outlet panel assembly is provided at 430. Axial fans are shown adjacent inlet panel 428 at 432 and 434 to provide air flow along a flow axis or direction represented by arrows 436–439. Eight converter modules are provided, the top row of four thereof being shown to include modules 70*a*, 70*c*, 70*e*, and 70*g*. A secondary or support channel is provided at 442 which holds supporting circuitry including an array of hold-up capacitors represented at 444. The regulated output connectors for the converter modules 70 are identified at 118 and 120 in combination with a converter module associated alphabetical suffix. For illustrative purposes, cabling as at 446 is seen connected to these output connectors. Note that the cabling resides with those connectors at a side transversely oriented with respect to the flow axis or direction as represented by arrows 436, 439. The orientation of the connectors transversely to the air flow axis is represented by arrow 440.

Figure 18:
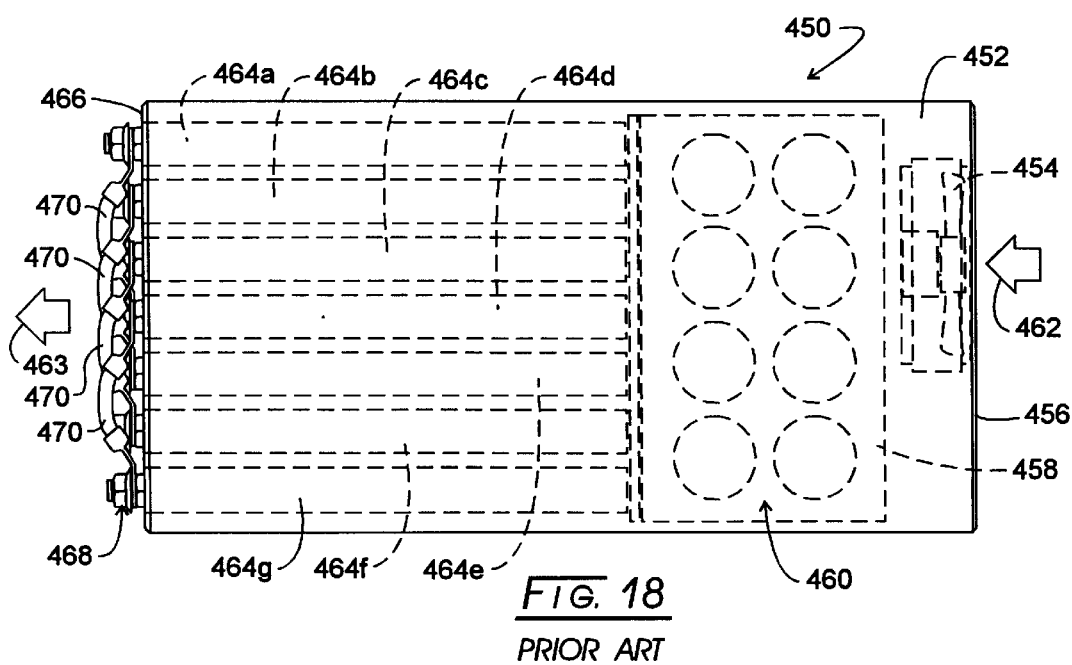
FIG. 18 is a top view of a power supply of the prior art showing internal components in phantom.

The structuring of power supplies 10, 300 and 420 may be contrasted with conventional techniques of packaging converter modules. Looking to FIG. 18, such a conventional power supply is represented in general at 450. The housing of this power supply as at 452 provides, for example, an axial fan 454 which is positioned before grate openings formed within an inlet end panel 456. Supporting or housekeeping circuitry is positioned immediately before the fan 454 as shown within block 458 which is seen to incorporate an array of hold-up capacitors 460. Air flow from the fan 454 is provided in the direction of arrows 462 and 463. The converter modules of this packaging design typically are arranged in a vertical sense between heat exchanging retainers and are aligned in parallel with the direction of air flow as represented at the noted arrows 462 and 463. Such an array of converter modules is represented at 464a–464g. Also in conventional fashion, the regulated output connectors are provided in two rows at an end panel or output panel 466, a top one of such rows being seen at 468. When cabling is attached to these connectors at row 468 as represented at 470, it tends to block the air flow through the power supply 450 which usually occasions impairment of the performance of the converter modules.

Figure 19:
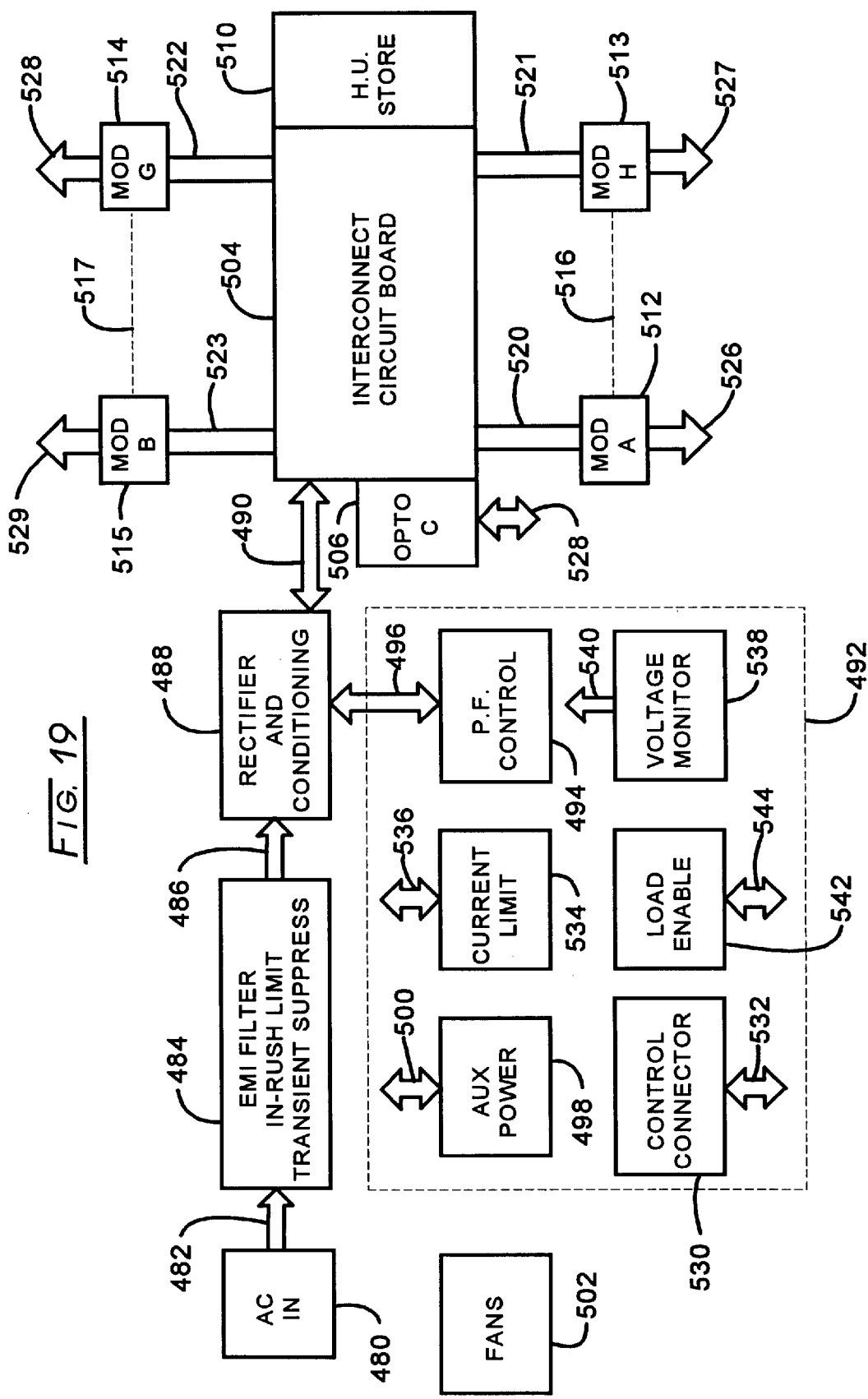
FIG. 19 is a block diagrammatic representation of supporting monitoring and control circuitry employed with the power supply of FIG. 10.

Referring to FIG. 19, a block diagrammatic representation of the circuitry employed to support the operation of the instant power supply is provided. The circuitry shown is primarily intended for employment with power supplies 300 and 420. With some modifications to be discussed, which deal principally with simplification, the diagram also applies with respect to power supply 10. In general, the circuitry is supported upon circuit boards which are in the support channel portions of the housings. However, one control circuit board is described in connection with FIG. 4 as being positioned in the lower portion of the region of fan assembly 140. For the most part, the circuitry is spaced away from the heat exchange channel of the housing to essentially maximize the cooling air or thermal exchange air application to the converter modules.

In FIG. 19, the "A.C. In" in function as described, for example, in FIG. 1 at 16, and in FIG. 10 at 310 is represented as a block 480. This line a.c. input is directed as represented at arrow 482 to front end signal treatment stages as are represented at block 484. The first treatment function represented at block 484 is that of carrying out electromagnetic interference filtering (EMI) a function of removing any electrical noise generated by the power supply. This functions in conventional fashion to eliminate radiofrequency interference on power lines. Because the power supplies utilize hold-up or ride-through capacitor arrays, the circuitry represented at block 484 also limits any in-rush current which may occur at the commencement of power up. Finally, block 485 indicates that transient suppression circuitry is present. This transient suppression function serves to eliminate surges or the like which might occur, for example, on the power line. Generally, this function is accommodated through the utilization of metal oxide varistors (MOV). Next, as represented at arrow 486 and block 488, the front-end treatment of the a.c. signal calls for rectification and conditioning for presentation to the inputs of the converter modules. For power supply 10, rectification is straightforward and the conditioning procedure is one wherein the voltage level of the input a.c. supply is determined and through a relay structure, the voltage level output at arrow 490 is adjusted. This auto-ranging feature accommodates for geographic or regional differences in standard line voltage values. For power supplies 300 and 420, which operate with greater power capacities, a boost topology converter is employed which functions to eliminate harmonics and achieve power factor control and d.c. voltage output at arrow 490 which is optimum for the most efficient operation of the d.c.-to-d.c. converter components of the converter modules. The boost converter is controlled from a "control board" represented by dashed boundary 492. Such control is provided by an an integrated circuit, for example a type LT1249. The power factor control within board 492 is represented at block 494 and arrow 496. Simultaneously with the commencement of rectification of the input signal at block 488, an auxiliary power supply is activated from the circuit board 492 as represented at block 498. This auxiliary power supply circuit provides "housekeeping" inputs to various supporting circuitry components of the power supplies, for example, providing a 12 v and 5 v auxiliary output as represented at arrow 500. Included in the supply of power from the auxiliary power supply is a 12 v input to the fan or fans of the system represented at block 502. Thus, the fans are energized essentially simultaneously with the activation of the system.

Conditioned d.c. power, for example at about 350 v, is delivered from the rectifier and conditioning function 488 as represented at arrow 490 to an interconnect circuit board 504. This main interconnect circuit board or "mother board" has been described at 170 in connection with FIGS. 5 and 7 and 376 in connection with FIGS. 15 and 16. The interconnect board basically is a series of interconnections, delivering the high voltage d.c. from rectifier conditioning function 488 to the inputs of the converter modules. The board also contributes the interconnect share circuit for the CSHARE signal distribution. In connection with power supply 300, the interconnect circuit board carries a bi-directional opto-isolation function to permit interaction between the high voltage input side of the power supplies and the low voltage outputs. This opto-isolation function is represented at block extension 506 and dual arrow 508. Inasmuch as the array of hold-up capacitors for power supply 300 is described at array 408 as mounted upon the interconnect circuit board, such identification of that function is represented in the instant figure at block 510. D.C. input as well as interactive monitoring and control functions are provided to converter modules A–H as are represented at blocks 512–515 and associated dashed lines 516 and 517. Communication with the interconnect circuit for blocks 512–515 is represented at respective arrows 520–523 and the regulated voltage outputs for the converter modules represented at blocks 512–515 are shown, respectively, at 526–529.

Returning to control circuit board 492, the multiple pin control connectors described in connection with FIG. 1 at 22 and FIG. 10 at 314 are represented at block 530. This multiple pin connector permits the user to turn on the system with an on/stand-by signal enabling the auxiliary power supply discussed in connection with block 498. That terminal is employed with a return or ground terminal. Additionally, the terminal may provide an a.c. ok signal which senses the a.c. input to the system and a d.c. ok signal which is developed by monitoring of the output from block 488. In this regard, the d.c. ok input is developed by monitoring the regulated output of each of the converter modules. Failure of one of those outputs will result in removal of the d.c. ok condition. The user may globally inhibit all converter modules or selectively inhibit discrete modules of the assembly. For example, any one of converter modules 250a–250h may be inhibited by signal applied to the control connector 530. Finally, +5 v d.c. is provided for the convenience of the user as is developed from the auxiliary power function represented at block 498. These inputs and outputs are represented in the figure at dual arrow 532.

Associated with the power factor correction-based control represented at block 488 is a function which monitors the a.c. line current input. In particular, a current limit function is represented at block 534 in conjunction with a dual arrow 536. With this function, line current is compared with a reference and a corresponding control is imposed upon the power factor correction controller discussed earlier in connection with block 494. Further, the control function monitors the output voltage which that power factor control conditioning is generating and varies it in accordance with the sensed input a.c. line voltage. This is carried out to provide the voltage monitoring function represented at block 538 and arrow 540. In this regard, for power supply 300, the system delivers an optimum 350 v d.c. to the inputs of the converter modules from the boost topology converter at block 488. Where high line conditions are encountered to the extent that the d.c. voltage input cannot be maintained at the optimum level, then it is boosted to a maximum of, for example, 380 v. Thus, only worst case line conditions will cause the operation of the converter modules at voltage levels higher than desired, but still acceptable. This improves the long-term reliability of the power supplies.

Block 542 and associated dual arrow 544 at the control board 492 represent a load enable function. In this regard, comparators are provided which monitor the d.c. input values generated from block 488. Until that d.c. voltage level is within specified limits, the system will not turn on any of the converter modules. This arrangement enhances the acceptable performance of the system. The power systems have been described, for example, as having LED perceptible indicators, for example, at openings 24 and 26 in FIG. 1. These provide an a.c. ok and d.c. ok visual output. The d.c. ok designated LED is energized in accordance with the earlier-discussed d.c. monitoring function. However, the a.c. ok, as it applies to this LED output is one which simply monitors line input to indicate that power is being supplied to the system.

Figure 20:
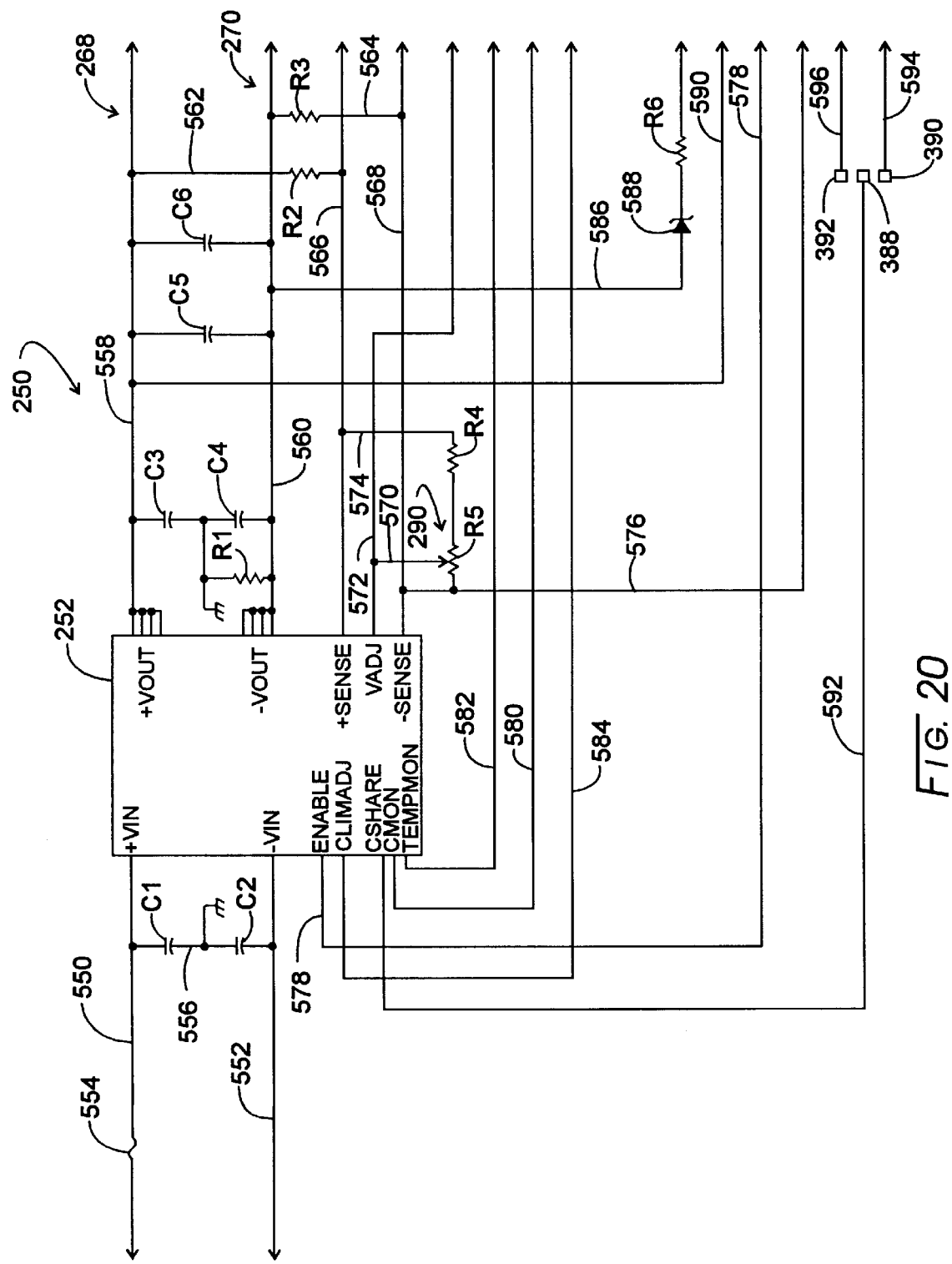
FIG. 20 is an electrical schematic diagram of a converter module described in conjunction with FIG. 8.

Referring to FIG. 20, a converter module suited for employment with power supply 300 is illustrated. The physical characteristics of this module have been described in connection with FIG. 8 at 250, which numeration returns in the instant figure. The converter module 250 includes a d.c.-to-d.c. converter 252, the d.c. input terminals of which are plugged into the interconnect board 376 from circuit lines 550 and 552. Line 550 incorporates a fuse 554 and the high voltage d.c. input is filtered at line 556 incorporating capacitors C1 and C2. The regulated voltage output of the converter 252 is provided at lines 558 and 560 which extend on the module circuit board 254 to connector assemblies 268 and 270 which are represented in general fashion in the instant figure. This regulated lower voltage output is filtered by a filter network including capacitors C3–C6 and resistor R1.

Regulated output lines 558 and 560 are tapped at respective lines 562 and 564 including resistors R2 and R3 to provide respective positive and negative voltage sense signals at lines 566 and 568. These remote sense lines may be connected to a load to allow the converter module to compensate for any voltage drop witnessed across conductors carrying load current. Thus, these outputs extend to the multiple pin monitor function output connectors made accessible to the user and described, for example, generally at 292 in connection with FIGS. 8 and 12. Adjustment of the output voltage of a converter may be provided to an extent of about ±10% by utilizing a trimming potentiometer 290 shown in the figure as being configured with a wiper arm 570 extending to a line 572 coupled to the voltage adjust terminal. Line 572 also provides a voltage out adjustment signal. The trimming potentiometer is completed with the connection represented at line 574 incorporating resistors R4 and R5 and extending to line 576. Line 576 provides a return output. Each of the controllers is selectively enabled at an enable terminal. In this regard, that terminal is coupled for connection with the interconnect circuit board and earlier-described control connector 530 (FIG. 19) as represented at line 578. A current monitoring (CMON) terminal on device 252 provides an indication of the amount of current supplied by the module, a proportioned signal being made available at line 580 to the noted multi-pin monitor function output connector 292. Next, a temperature monitoring terminal (TEMPMON) is coupled to the noted connector 292 via line 582. This terminal provides an indication of the converter's internal temperature. A current limiting adjustment (CLIMADJ) terminal on device 252 is associated with a constant current limiting circuit which protects the converter under overload or short circuit conditions. That terminal is coupled via line 584 to the noted connector 292. The earlier-noted d.c. ok signal is provided at line 586 which extends through Zener diode 588 and resistor R6 to the interconnect circuit board and the corresponding voltage tap of opposite polarity is seen at line 590. Finally, the earlier-described "CSHARE" signal which insures that all converters in a parallel system accurately share current is tapped at line 592 which is shown directed to earlier-described center pad 388. Earlier-described top/bottom pad 390 is also shown on the drawings in connection with lead 594 and earlier-described adjacent position pad 392 is reproduced on the drawing in connection with output line 596. These lines 592, 594 and 596 represent the inter-module parallel coupling circuit, line 594 constituting the vertical connecting circuit and line 596 the adjacency connecting circuit. Lines 594 and 596 are directed, as described above, to the interconnect circuit board 376.

In general, the same arrangement is provided in conjunction with converter modules as described at 70.

Since certain changes may be made in the above-described apparatus without departing from the scope of the invention herein involved, it is intended that all matter contained in the description thereof or shown in the accompanying drawings shall be interpreted as illustrative and not in a limiting sense.

It is claimed:

1. Power supply apparatus connectable with an external power input for deriving a regulated D.C. source, comprising:

a heat exchange channel extending along a flow axis between first and second openings and having at least one outwardly disposed heat transfer surface defining assembly;

at least one power converter module having a heat sink surface, an input connector assembly and regulated output connectors extending outwardly in a given direction therefrom, said heat sink surface being coupled in thermal exchange relationship with a said channel heat transfer surface and arranged thereon to position said regulated output connectors in an orientation wherein said given direction is transverse to said flow axis; and a fan assembly mounted in air flow establishing relationship with said heat exchange channel first opening and directing air flow along said axis from said first opening through said second opening.

2. The power supply apparatus of claim 1 in which said heat exchange channel is formed having two substantially parallel oppositely disposed said heat transfer surfaces.

3. The power supply apparatus of claim 1 in which said heat exchange channel includes a multiple channel heat exchanger assembly, each said channel of which is aligned in parallel with said flow axis.

4. The power supply apparatus of claim 1 in which:

said heat exchange channel is formed having two substantially parallel oppositely disposed spaced apart said heat transfer surfaces extending between first and second channel side regions; and including an interconnect circuit mounted upon an interconnect circuit board extending along said first side region in substantially parallel relationship with said flow axis, said interconnect circuit board being removably connectable with said power converter module input connector assembly.

5. The power supply apparatus of claim 4 including:

a support circuit connectable with said external power input and deriving a conditioned input therefrom; and said interconnect circuit is coupled intermediate said support circuit and said power converter module input connector assembly for applying said conditioned input thereto.

6. The power supply apparatus of claim 5 in which:

said heat exchange channel, said power converter module, said interconnect circuit, said support circuit, and said fan assembly are mounted within a housing;

said input treatment circuit being mounted adjacent said interconnect circuit board outwardly from said heat exchange channel first side region.

7. The power supply apparatus of claim 5 including:

a housing assembly positioned about said heat exchange channel and spaced outwardly from said first side region to define a support channel aligned substantially in parallel relationshp with said flow axis; and said interconnect circuit and at least a portion of said support circuit are mounted within said support channel.

8. The power supply apparatus of claim 7 in which said fan assembly comprises two axial flow fans each directing air flow toward said heat exchange channel first opening and one thereof additionally directing air into said support channel.

9. The power supply apparatus of claim 5 in which said fan assembly is a cross-flow fan having an output positioned at said heat exchange channel first opening and extending substantially between said first and second side regions.

10. The power supply apparatus of claim 5 in which:

said power converter module includes a module circuit board and a D.C.-to-D.C. switching power converter mounted thereon at a mounting region intermediate said input connector assembly and said regulated output connectors, including a monitor function output connector mounted upon said module circuit board adjacent said regulated output connectors and electrically coupled with monitor function terminals located upon said power converter, said monitor function output connector and said regulated output connectors being located for external user access adjacent said second channel side region when said module input connector assembly is connected with said interconnect circuit board.

11. Power supply apparatus connectable with an A.C. source for deriving a regulated D.C. output, comprising:

a heat exchange channel extending along a flow axis between first and second openings and having oppositely disposed spaced apart first and second heat sinks with respective flat, first and second outwardly disposed heat transfer surfaces and first and second side regions extending along in parallel adjacency with said flow axis;

first and second power converter modules having respective first and second heat sink surfaces, respective first and second input connector assemblies and respective first and second regulated output connectors extending outtwardly in a given direction, said first and second heat sink surfaces being coupled in intimate thermal exchange relationship with said first heat transfer surface and arranged thereon to position said first and second regulated output connectors adjacent said second side region in an orientation wherein said given direction is transverse to said flow axis;

third and fourth power converter modules having respective third and fourth heat sink surfaces, respective third and fourth input connector assemblies and respective third and fourth regulated output connectors extending outwardly in a given direction, said third and fourth heat sink surfaces being coupled in intimate thermal exchange relationship with said second heat transfer surface and arranged thereon to position said third and fourth regulated output connectors in an orientation wherein said given direction is transverse to said flow axis;

a fan assembly mounted in air flow establishing relationship with said heat exchange channel first opening and directing air flow along said axis from said first opening through said second opening;

a support circuit connectable with said A.C. source and deriving a conditioned D.C. input therefrom; and an interconnect circuit electrically coupled with said support circuit and each said first, second, third, and fourth input connector assemblies for conveying said conditioned D.C. input thereto.

12. The power supply apparatus of claim 11 in which:

each said first, second, third, and fourth power connector assemblies include a module circuit board and a D.C.-to-D.C. switching power converter mounted thereon at a mounting region intermediate said input connector assembly and said regulated output connectors, including an inter-module parallel coupling circuit extending to said input connector assembly and having a module share circuit connected with a current share terminal of said switching power converter;

said interconnect circuit includes an interconnect share circuit coupled with each said inter-module parallel coupling circuit at said input connector assemblies; and selector means for interconnecting the said inter-module parallel coupling circuits of said first, second, third, and fourth power converter modules to derive a select circuit configuration.

13. The power supply apparatus of claim 12 in which:

each said inter-module parallel coupling circuit further includes an adjacency connecting circuit coupled with said input connector assembly, and a vertical connecting circuit coupled with said input connector assembly; and said interconnect circuit share circuit is electrically connectable with said adjacency circuits of said first and third power converter modules through respective said first and third input connectors, and is electrically connectable with said vertical connecting circuits of said first and second power converter modules through respective said first and second input connectors.

14. The power supply apparatus of claim 13 in which said selector means comprises:

a first share connector mounted upon each said module circuit board and electrically coupled with said module share circuit;

a second share connector mounted upon each said module circuit board in adjacency with said first connector and electrically connected with said adjacency connecting circuit;

a third share connector mounted upon each said module circuit board in adjacency with said first share connector and electrically connected with said vertical connecting circuit; and connection means for selectively electrically connecting said first share connector with said second share connector and for selectively electrically connecting said first share connector with said third share connector.

15. The power supply apparatus of claim 14 in which said first, second and third share connectors are electrically conducting pads located in closely spaced adjacency upon said module circuit board.

16. The power supply apparatus of claim 11 in which:

said first heat sink includes a first multi-channel form heat exchanger assembly coupled in heat exchange relationship with said first heat transfer surface, each said channel of which is aligned in parallel with said flow axis; and said second heat sink includes a second multi-channel form heat exchanger assembly coupled in heat exchange relationship with said second heat transfer surface, each said channel of which is aligned in parallel with said flow axis.

17. The power supply apparatus of claim 15 in which said first and second multi-channel heat exchanger assemblies are configured as metal sheets with an undulating cross-sectional pattern defining said multi-channel form.

18. The power supply apparatus of claim 17 in which said first and second multi-channel heat exchanger assemblies are mutually internested.

19. The power supply apparatus of claim 11 in which each said first and second power converter module includes a module circuit board and a D.C.-to-D.C. switching power converter mounted thereon at a mounting region intermediate said input connector assembly and said regulated output connectors, including a monitor function output connector mounted upon said module circuit board adjacent said regulated output connector and electrically coupled with a monitor function terminal located upon said power converter, said monitor function output connector and said regulated output connectors being located for external user access adjacent said second channel side region.

20. The power supply apparatus of claim 11 in which each said first and second power converter module includes a module circuit board and a D.C.-to-D.C. switching power converter mounted thereon at a mounting region intermediate said input connector assembly and two said regulated output connectors, each said regulated output connector comprising a pin insertion connector mounted upon said module circuit board at a location for power supply coupling with a load-defining circuit board.

21. The power supply apparatus of claim 11 in which:

said interconnect circuit is supported by an interconnect circuit board extending along said heat exchange channel first side region, said interconnect circuit board supporting first, second, third, and fourth interconnect plug-in connectors for receiving respective said first, second, third and fourth input connector assemblies in electrical communication with said interconnect circuit;

each said first, second, third and fourth power converter module includes a respective first, second, third and fourth module circuit board and a respective first, second, third and fourth D.C.-to-D.C. switching power converter mounted thereon at a mounting region intermediate said input connector assembly and said regualted output connectors, said input connector assembly comprising respectively first, second, third and fourth module plug-in connectors removably insertable into electrical communication with respective said first, second, third and fourth interconnect plug-in connectors.

22. The power supply apparatus of claim 21 including:

a housing assembly positioned about said heat exchange channel and spaced outwardly from said first side region to define a support channel aligned substantially in parallel relationship with said flow axis; and at least a portion of said interconnect circuit and said support circuit are mounted within said support channel.

23. The power supply apparatus of claim 22 in which said fan assembly comprises two axial flow fans each directing air flow toward said heat exchange channel first opening and one thereof additionally directing air into said support channel.

24. The power supply apparatus of claim 22 in which said fan assembly is a cross-flow fan having an output positioned at said heat exchange channel first opening and extending substantially between said first and second side regions.

25. Power supply apparatus connectable with an A.C. source for deriving a regulated D.C. output, comprising:

a heat exchange channel extending along a flow axis between first and second openings and having oppositedly disposed first and second heat sinks with respective flat first and second outwardly disposed heat transfer surfaces and first and second side regions extending along in parallel adjacency with said flow axis;

first and second power converter modules having respective first and second heat sink surfaces, respective first and second input connector assemblies and respective first and second regulated output connectors extending outwardly in a given direction, said first and second heat sink surfaces being coupled in intimate thermal exchange relationship with said first heat transfer surface and arranged thereon to position said first and second regulated output connectors adjacent said second side region in an orienation wherein said given direction is transverse to said flow axis;

third and fourth power converter modules having respective third and fourth heat sink surfaces, respective third and fourth input connector assemblies and respective third and fourth regulated output connectors extending outwardly in a given direction, said third and fourth heat sink surfaces being coupled in intimate thermal exchange relationship with said second heat transfer surface and arranged thereon to position said third and fourth regulated output connectors in an orientation wherein said given direction is transverse to said flow axis;

a fan assembly mounted in air flow establishing relationship with said heat exchange channel first opening and directing air flow along said axis from said first opening through said second opening;

a housing assembly including a U-shaped support housing extending in parallel adjacency with said flow axis and extending outwardly from said second side region to define a support channel, a cover assembly extending about said heat exchange channel, said first, second, third and fourth power converter modules, and at least a portion of said fan assembly, having openings at said second side region for accessing said first, second, third and fourth regulated output connectors and being connected with said support housing at said first side region, an air inlet end assembly coupled with said cover assembly and said support housing outwardly from said fan assembly, and an air outlet assembly coupled with said cover assembly and said support housing adjacent said second opening;

an interconnect circuit board extending along said first side region;

a support circuit connectable with said A.C. source and deriving a conditioned D.C. input therefrom; and an interconnect circuit supported by said interconnect circuit board, electrically coupled with said support circuit and each said first, second, third, and fourth input connector assemblies for conveying said conditioned D.C. input thereto.

26. The power supply apparatus of claim 25 in which:

said first heat sink includes a first multi-channel form heat exchanger assembly coupled in heat exchange relationship with said first heat transfer surface, each said channel of which is aligned in parallel with said flow axis; and said second heat sink includes a second multi-channel form heat exchanger assembly coupled in heat exchange relationship with said second heat transfer surface, each said channel of which is aligned in parallel with said flow axis.

27. The power supply apparatus of claim 26 in which said first and second multi-channel heat exchanger assemblies are configured as metal sheets with an undulating cross-sectional pattern defining said multi-channel form.

28. The power supply apparatus of claim 25 in which said first and second multi-channel heat exchanger assemblies are mutually internested.

29. The power supply apapratus of claim 25 in which each said first and second power converter module includes a module circuit board and a D.C.-to-D.C. switching power converter mounted thereon at a mounting region intermediate said input connector assembly and said regulated output connectors, including a monitor function output connector mounted upon said module circuit board adjacent said regulated output connector and electrically coupled with monitor function terminal located upon said power converter, said monitor function output connector and said regulated output connectors being located for external user access adjacent said second channel side region.

30. The power supply apparatus of claim 25 in which each said first and second power converter module includes a module circuit board and a D.C.-to-D.C. switching power converter mounted thereon at a mounting region intermediate said input connector assembly and two said regulated output connectors, each said regulated output connector comprising a pin insertion connector mounted upon said module circuit board at a location for power supply coupling with a load-defining circuit board.

31. The power supply apparatus of claim 25 in which at least a portion of said interconnect circuit and said support circuit are located within said support channel.

32. The power supply apparatus of claim 25 in which:

said interconnect circuit includes first, second, third and fourth plug-in connectors for receiving respective first, second, third and fourth input connector assemblies; and each said first, second, third and fourth power converter module includes a respective first, second, third and fourth module circuit board and a respective first, second, third and fourth D.C.-to-D.C. switching power converter mounted thereon at a mounting region intermediate said input connector assembly and said regualted output connectors, said input connector assembly comprising respectively first, second, third and fourth module plug-in connectors removably insertable into electrical communication with respective said first, second, third and fourth interconnect plug-in connectors.

\* \* \* \* \*